United States Patent
Peng et al.

(10) Patent No.: US 12,210,291 B2
(45) Date of Patent: Jan. 28, 2025

(54) ABERRATION IMPACT SYSTEMS, MODELS, AND MANUFACTURING PROCESSES

(71) Applicant: ASML NETHERLANDS B.V., Veldhoven (NL)

(72) Inventors: Xingyue Peng, San Jose, CA (US); Zhan Shi, San Jose, CA (US); Duan-Fu Stephen Hsu, Fremont, CA (US); Rafael C. Howell, Santa Clara, CA (US); Gerui Liu, Santa Clara, CA (US)

(73) Assignee: ASML NETHERLANDS B.V., Veldhoven (NL)

(*) Notice: Subject to any disclaimer, the term of this patent is extended or adjusted under 35 U.S.C. 154(b) by 53 days.

(21) Appl. No.: 17/927,866

(22) PCT Filed: May 14, 2021

(86) PCT No.: PCT/EP2021/062795
§ 371 (c)(1),
(2) Date: Nov. 25, 2022

(87) PCT Pub. No.: WO2021/249720
PCT Pub. Date: Dec. 16, 2021

(65) Prior Publication Data
US 2023/0205096 A1     Jun. 29, 2023

Related U.S. Application Data

(60) Provisional application No. 63/147,831, filed on Feb. 10, 2021, provisional application No. 63/037,494, filed on Jun. 10, 2020.

(51) Int. Cl.
*G03F 7/00*     (2006.01)

(52) U.S. Cl.
CPC .......... *G03F 7/705* (2013.01); *G03F 7/70525* (2013.01); *G03F 7/706* (2013.01)

(58) Field of Classification Search
CPC ...... G03F 7/705; G03F 7/70525; G03F 7/706; G03F 7/70891
See application file for complete search history.

(56) References Cited

U.S. PATENT DOCUMENTS

| | | |
|---|---|---|
| 5,229,872 A | 7/1993 | Mumola |
| 6,046,792 A | 4/2000 | Van Der Werf et al. |

(Continued)

FOREIGN PATENT DOCUMENTS

| | | |
|---|---|---|
| EP | 2028456 | 2/2009 |
| EP | 3444674 | 2/2019 |

(Continued)

OTHER PUBLICATIONS

International Search Report and Written Opinion dated Aug. 17, 2021, issued in corresponding International Application No. PCT/EP2021/062795, pp. 1-8.

(Continued)

*Primary Examiner* — Deoram Persaud
(74) *Attorney, Agent, or Firm* — Pillsbury Winthrop Shaw Pittman LLP

(57) ABSTRACT

Scanner aberration impact modeling in a semiconductor manufacturing process, which may facilitate co-optimization of multiple scanners. Scanner aberration impact modeling may include executing a calibrated model and controlling a scanner based on output from the model. The model is configured to receive patterning system aberration data. The model is calibrated with patterning system aberration calibration data and corresponding patterning process impact calibration data. New pattering process impact data may be determined, based on the model, for the received (Continued)

patterning system aberration data. The model includes a hyperdimensional function configured to correlate the received patterning system aberration data with the new patterning process impact data. The hyperdimensional function is configured to correlate the received patterning system aberration data with the new patterning process impact data in an approximation form, in lieu of a full simulation, without involving calculation of an aerial image or a representation thereof.

20 Claims, 18 Drawing Sheets

(56) References Cited

U.S. PATENT DOCUMENTS

| | | | |
|---|---|---|---|
| 6,934,930 B2 | 8/2005 | Blatchford, Jr. et al. | |
| 7,075,651 B2 | 7/2006 | Tsukakoshi | |
| 7,262,831 B2 | 8/2007 | Akhssay et al. | |
| 7,587,704 B2 | 9/2009 | Ye et al. | |
| 8,200,468 B2 | 6/2012 | Ye et al. | |
| 9,170,497 B2 | 10/2015 | Bittner et al. | |
| 9,846,367 B2 | 12/2017 | Bittner et al. | |
| 10,018,907 B2 | 7/2018 | Bittner et al. | |
| 10,261,423 B2 | 4/2019 | Swaenen et al. | |
| 10,303,063 B2 | 5/2019 | Bittner et al. | |
| 10,761,429 B2 | 9/2020 | Wolf | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2009/0296055 A1 | 12/2009 | Ye et al. | |
| 2010/0162197 A1 | 6/2010 | Ye et al. | |
| 2010/0180251 A1* | 7/2010 | Ye | G03F 1/36 716/53 |
| 2011/0181855 A1* | 7/2011 | Bittner | G03F 7/70525 355/55 |
| 2012/0113404 A1* | 5/2012 | Hsu | G03F 7/70125 355/67 |
| 2013/0258302 A1* | 10/2013 | Bittner | G03F 7/70891 355/67 |
| 2014/0313499 A1* | 10/2014 | Fukagawa | G02B 7/005 355/67 |

FOREIGN PATENT DOCUMENTS

| | | |
|---|---|---|
| JP | 2018520374 | 7/2018 |
| TW | 200931200 | 7/2009 |
| WO | 2020002143 | 1/2020 |

OTHER PUBLICATIONS

Office Action dated Mar. 29, 2022, issued in corresponding Taiwan Patent Application No. 110120138, pp. 1-6.
Liu, Peng et al., "A computational method for optimal application specific lens control in microlithography", Proc. of SPIE, vol. 7640, pp. 76400M-1-76400M-10 (Mar. 2010).
Guerrero, James et al., "Validation of an intrafield overlay prediction process", Proc. of SPIE, vol. 4346, pp. 1598-1607 (Sep. 2001).
Van Der Laan, Hans et al., "Aerial image measurement methods for fast aberration set-up and illumination pupil verification", Proc. of SPIE, vol. 4346, pp. 394-407 (Sep. 2001).
Office Action issued in corresponding Japanese Patent Application No. 2022-573169, dated Feb. 26, 2024.

* cited by examiner

1200

$$S = S_{critical} + S_{regulation} + S_{actuator} + S_{wavefront}$$

ABERRATION IMPACT SYSTEMS, MODELS, AND MANUFACTURING PROCESSES

CROSS-REFERENCE TO RELATED APPLICATIONS

This application is the U.S. national phase entry of PCT Patent Application No. PCT/EP2021/062795 which was filed on May 14, 2021, which claims priority of U.S. Provisional Patent Application No. 63/037,494 which was filed on Jun. 10, 2020 and of U.S. Provisional Patent Application No. 63/147,831 which was filed on Feb. 10, 2021 which are incorporated herein in their entireties by reference.

TECHNICAL FIELD

The description herein relates generally to lithography in semiconductor manufacturing, and more particularly, to computational lithography.

BACKGROUND

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

Lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced. At the same time, the number of functional elements, such as transistors, per device has been steadily increasing, following a trend commonly referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-k1 lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

OPC and other RET utilize robust electronic models that describe the lithography process. Calibration procedures for such lithography models are thus desired that provide valid, robust and accurate models across the process window. Currently, calibration is done using a certain number of 1-dimensional and/or 2-dimensional gauge patterns with wafer measurements. More specifically, the 1-dimensional gauge patterns include line-space patterns with a varying pitch and critical dimension (CD), isolated lines, multiple lines, etc. The 2-dimensional gauge patterns typically include line-ends, contacts, and randomly selected SRAM (Static Random Access Memory) patterns.

SUMMARY

According to an embodiment, there is provided a non-transitory computer readable medium having instructions thereon. The instructions, when executed by a computer, cause the computer to execute a calibrated model configured to receive patterning system aberration data. The model is calibrated with patterning system aberration calibration data and corresponding patterning process impact calibration data. The instructions are configured to cause the computer to determine, based on the model, new patterning process impact data for the received patterning system aberration data. The model comprises a hyperdimensional function configured to correlate the received patterning system aberration data with the new patterning process impact data without simulation, generation or otherwise calculation of an aerial image or a representation thereof.

In some embodiments, the hyperdimensional function is configured to correlate the received patterning system aberration data with the new patterning process impact data in an approximation and/or a simplified form in lieu of a full simulation.

In some embodiments, the model is calibrated by providing the patterning system aberration calibration data to a base model to obtain a prediction of the patterning process impact calibration data, and using the patterning process impact calibration data as feedback to update one or more configurations of the base model. The one or more configurations are updated based on a comparison between the patterning process impact calibration data and the prediction of the patterning process impact calibration data.

In some embodiments, the model comprises one or more non-linear, linear, and/or quadratic algorithms.

In some embodiments, updating the one or more configurations of the base model comprises calibrating one or more parameters of an algorithm.

In some embodiments, the received patterning system aberration data comprises received wavefront data, and wherein the new patterning process impact data comprises one or more patterning process metrics.

In some embodiments, the one or more patterning process metrics comprise a critical dimension, a pattern placement error, an edge placement error, critical dimension asymmetry, a best focus shift, or a defect count associated with a patterning process.

In some embodiments, the model comprises one or more critical feature components configured to model patterning system to patterning system variation for critical features of a patterning process; and one or more regulation components configured to model generic performance across patterning systems for non-critical features of the patterning process.

In some embodiments, the new patterning process impact data from the model is configured to be provided to a cost function to facilitate determination of costs associated with individual patterning process metrics and/or costs associated with individual patterning process variables.

In some embodiments, the cost function comprises a first component associated with critical features of a patterning process, a second component associated with non-critical features of a patterning process, and a third component associated with physical functional limitations of one or more patterning systems.

In some embodiments, the cost function further comprises a fourth component associated with a patterning process wavefront regulation penalty.

In some embodiments, the new patterning process impact data output from the model is configured to facilitate co-optimization of multiple patterning systems.

In some embodiments, the multiple patterning systems comprise scanners, and the co-optimization comprises using lens actuators as variables, and a gradient based non-linear optimizer to co-determine actuator positions for multiple scanners.

In some embodiments, the new patterning process impact data from the model is configured to be used to determine a set of patterning process control metrics, the set of patterning process control metrics configured to be determined by a linear solver.

In some embodiments, the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

In some embodiments, the new patterning process impact data from the model is configured to be provided to a cost function to facilitate determination of costs associated with individual patterning process metrics. The costs associated with the individual patterning process metrics are configured to be provided back to the model to facilitate determination of and/or costs associated with patterning process wavefront regulation. The costs associated with the patterning process wavefront regulation are configured to be provided to a driver lens model to facilitate determination of costs associated with individual patterning process variables. The costs associated with the individual patterning process variables are configured to be provided to an optimizer to facilitate co-optimization of multiple patterning systems.

In some embodiments, the model is calibrated such that the new patterning process impact data is configured to facilitate enhanced control of heating of one or more mirrors and/or lenses of the patterning system.

In some embodiments, the patterning system aberration calibration data are simulated based on associated pupil shapes and patterning device designs.

In some embodiments, the new patterning process impact data comprises a cost function for a corresponding patterning system aberration, s(Z). The patterning system aberration s(Z) is defined by the received patterning system aberration data.

In some embodiments, the cost function s(Z) is indicative of an impact on the patterning process caused by the corresponding patterning system aberration.

In some embodiments, the new patterning process impact data from the model is configured to be provided to a second model to facilitate dynamic in-situ aberration control of a patterning system. In some embodiments, the second model is a projection optics correction model.

In some embodiments, the patterning system comprises a scanner. Dynamic in-situ control of the scanner comprises generating a corrected scanner control parameter recipe for a given scanner aberration to optimize a set of lithography performance metrics.

In some embodiments, the new patterning process impact data from the model is configured to be used to determine a set of patterning process control metrics. The set of patterning process control metrics is configured to be determined by a linear solver.

In some embodiments, the patterning process control metrics comprise lithography metrics.

In some embodiments, the new patterning process impact data from the model comprises a cost function Hessian. Determining the set of patterning process control metrics comprises performing a singular value decomposition on the Hessian.

In some embodiments, the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

In some embodiments, the model is calibrated such that the new patterning process impact data is configured to facilitate enhanced control of heating of one or more mirrors and/or lenses of the patterning system.

In some embodiments, the model is calibrated such that the new patterning process impact data is configured to facilitate enhanced control of a focus, a dose, and/or stage variation (MSD) associated with the patterning system.

According to another embodiment, there is provided a method for determining patterning process impact data. The method comprises executing a calibrated model configured to receive patterning system aberration data. The model is calibrated with patterning system aberration calibration data and corresponding patterning process impact calibration data. The method comprises determining, based on the model, new patterning process impact data for the received patterning system aberration data. The model comprises a hyperdimensional function configured to correlate the received patterning system aberration data with the new patterning process impact data without simulation, generation or otherwise calculation of an aerial image representation.

In some embodiments, the hyperdimensional function is configured to correlate the received patterning system aberration data with the new patterning process impact data in an approximation and/or a simplified form in lieu of a full simulation.

In some embodiments, the model is calibrated by providing the patterning system aberration calibration data to a base model to obtain a prediction of the patterning process impact calibration data, and using the patterning process impact calibration data as feedback to update one or more configurations of the base model. The one or more configurations are updated based on a comparison between the patterning process impact calibration data and the prediction of the patterning process impact calibration data.

In some embodiments, the model comprises one or more non-linear, linear, and/or quadratic algorithms.

In some embodiments, updating the one or more configurations of the base model comprises calibrating one or more parameters of an algorithm.

In some embodiments, the received patterning system aberration data comprises received wavefront data, and wherein the new patterning process impact data comprises one or more patterning process metrics.

In some embodiments, the one or more patterning process metrics comprise a critical dimension, a pattern placement error, an edge placement error, critical dimension asymmetry, a best focus shift, or a defect count associated with a patterning process.

In some embodiments, the model comprises one or more critical feature components configured to model patterning system to patterning system variation for critical features of a patterning process; and one or more regulation components configured to model generic performance across patterning systems for non-critical features of the patterning process.

In some embodiments, the new patterning process impact data from the model is configured to be provided to a cost function to facilitate determination of costs associated with individual patterning process metrics and/or costs associated with individual patterning process variables.

In some embodiments, the cost function comprises a first component associated with critical features of a patterning process, a second component associated with non-critical features of a patterning process, and a third component associated with physical functional limitations of one or more patterning systems.

In some embodiments, the cost function further comprises a fourth component associated with a patterning process wavefront regulation penalty.

In some embodiments, the new patterning process impact data output from the model is configured to facilitate co-optimization of multiple patterning systems.

In some embodiments, the multiple patterning systems comprise scanners, and the co-optimization comprises using lens actuators as variables, and a gradient based non-linear optimizer to co-determine actuator positions for multiple scanners.

In some embodiments, the new patterning process impact data from the model is configured to be used to determine a set of patterning process control metrics, the set of patterning process control metrics configured to be determined by a linear solver.

In some embodiments, the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

In some embodiments, the new patterning process impact data from the model is configured to be provided to a cost function to facilitate determination of costs associated with individual patterning process metrics. The costs associated with the individual patterning process metrics are configured to be provided back to the model to facilitate determination of and/or costs associated with patterning process wavefront regulation. The costs associated with the patterning process wavefront regulation are configured to be provided to a driver lens model to facilitate determination of costs associated with individual patterning process variables. The costs associated with the individual patterning process variables are configured to be provided to an optimizer to facilitate co-optimization of multiple patterning systems.

In some embodiments, the model is calibrated such that the new patterning process impact data is configured to facilitate enhanced control of heating of one or more mirrors and/or lenses of the patterning system.

In some embodiments, the patterning system aberration calibration data are simulated based on associated pupil shapes and patterning device designs.

In some embodiments, the new patterning process impact data comprises a cost function for a corresponding patterning system aberration, s(Z). The patterning system aberration s(Z) is defined by the received patterning system aberration data.

In some embodiments, the cost function s(Z) is indicative of an impact on the patterning process caused by the corresponding patterning system aberration.

In some embodiments, the new patterning process impact data from the model is configured to be provided to a second model to facilitate dynamic in-situ aberration control of a patterning system. In some embodiments, the second model is a projection optics correction model.

In some embodiments, the patterning system comprises a scanner. Dynamic in-situ control of the scanner comprises generating a corrected scanner control parameter recipe for a given scanner aberration to optimize a set of lithography performance metrics.

In some embodiments, the new patterning process impact data from the model is configured to be used to determine a set of patterning process control metrics. The set of patterning process control metrics is configured to be determined by a linear solver.

In some embodiments, the patterning process control metrics comprise lithography metrics.

In some embodiments, the new patterning process impact data from the model comprises a cost function Hessian. Determining the set of patterning process control metrics comprises performing a singular value decomposition on the Hessian.

In some embodiments, the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

In some embodiments, the model is calibrated such that the new patterning process impact data is configured to facilitate enhanced control of heating of one or more mirrors and/or lenses of the patterning system.

In some embodiments, the model is calibrated such that the new patterning process impact data is configured to facilitate enhanced control of a focus, a dose, and/or stage variation (MSD) associated with the patterning system.

According to another embodiment, there is provided a non-transitory computer readable medium having instructions thereon. The instructions when executed by a computer, cause the computer to perform the method in any of the paragraphs above.

According to another embodiment, there is provided a non-transitory computer readable medium having instructions thereon, the instructions when executed by a computer, causing the computer to execute an electronic model for determining patterning process impact data without calculation of a patterning process aerial image representation. The patterning process impact data is configured to facilitate co-optimization of multiple scanners used in a patterning process. The instructions cause operations comprising: providing patterning system aberration data to the model, the model comprising a hyperdimensional function configured to correlate the received patterning system aberration data with patterning process impact data; and determining, based on the model, new patterning process impact data for the received patterning system aberration data, wherein the new patterning process impact data from the model is configured to be provided to a cost function to facilitate determination of costs associated with individual patterning process metrics and/or costs associated with individual patterning process variables, and wherein the costs associated with individual patterning process metrics and/or costs associated with individual patterning process variables are configured to be used to facilitate the co-optimization of the multiple scanners.

In some embodiments, the patterning system aberration data provided to the model comprises wavefront data, and wherein the new patterning process impact data comprises one or more patterning process metrics.

In some embodiments, the model comprises one or more critical feature components configured to model scanner to scanner variation for critical features of a patterning process; and one or more regulation components configured to model generic performance across scanners for non-critical features of the patterning process.

In some embodiments, the cost function comprises a first component associated with critical features of a patterning process, a second component associated with non-critical features of a patterning process, and a third component associated with physical functional limitations of one or more scanners.

In some embodiments, the co-optimization comprises using lens actuators as variables, and a gradient based non-linear optimizer to co-determine actuator positions for multiple scanners.

According to another embodiment, there are provided one or more non-transitory, computer-readable media storing a prediction model and instructions that, when executed by one or more processors, provides the prediction model. The prediction model is produced by: obtaining patterning system aberration data and corresponding patterning process impact data; providing the patterning system aberration data to a base prediction model to obtain a prediction of the patterning process impact data; and using the patterning process impact data as feedback to update one or more configurations of the base prediction model, wherein the one or more configurations are updated based on a comparison between the patterning process impact data and the prediction of the patterning process impact data. The prediction model comprises a hyperdimensional function configured to correlate the patterning system aberration data with the patterning process impact data without calculation of an aerial image.

In some embodiments, the prediction model comprises a linear or quadratic algorithm.

In some embodiments, updating the one or more configurations of the prediction model comprises calibrating one or more parameters of the function.

In some embodiments, the patterning system aberration data are simulated based on associated pupil shapes and patterning device designs.

In some embodiments, the patterning process impact data comprises a cost function for a corresponding patterning system aberration, s(Z), the patterning system aberration defined by the patterning system aberration data.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which:

FIG. 12 illustrates components of a cost function, according to an embodiment.

DETAILED DESCRIPTION

Figure 1:
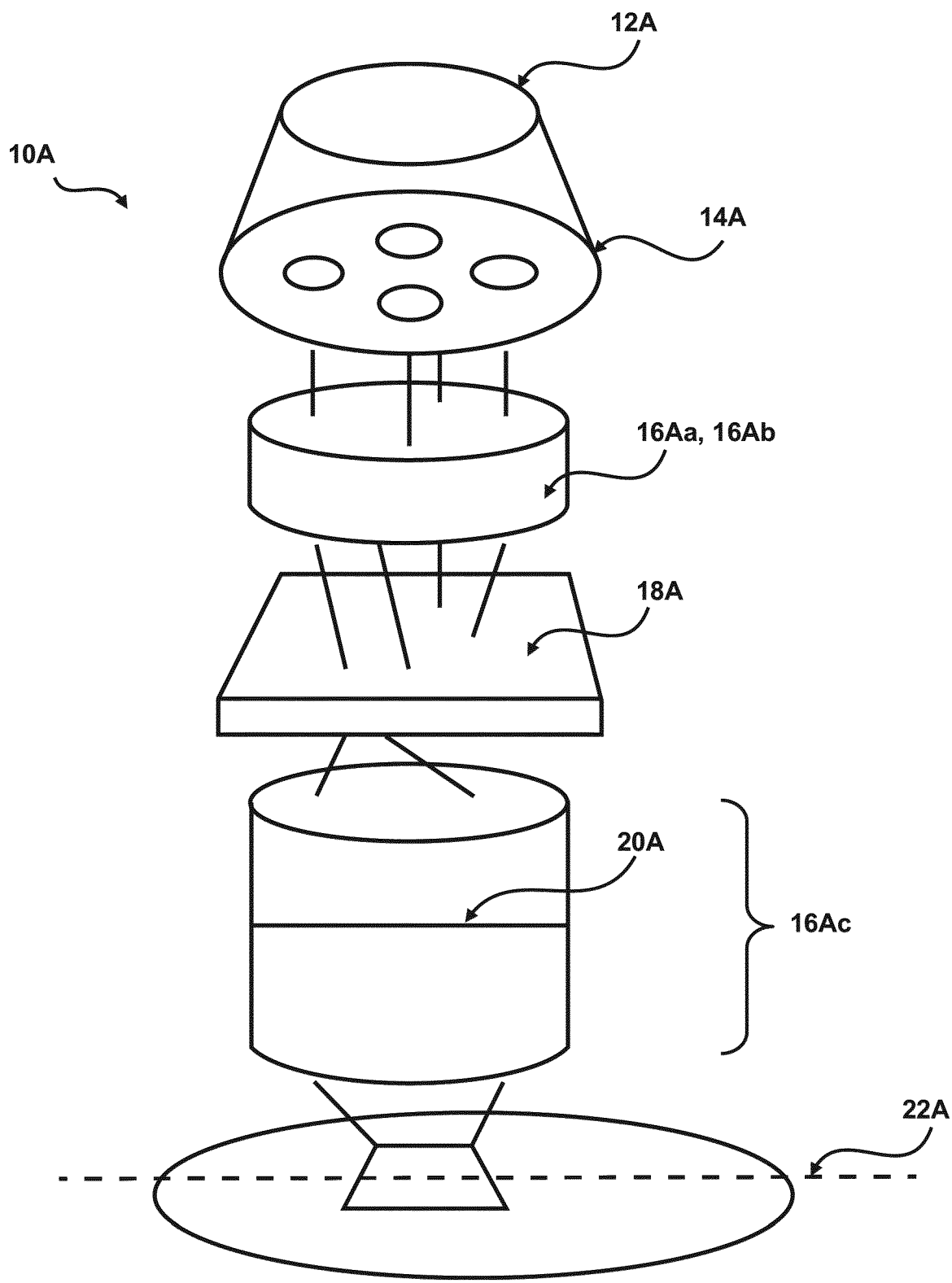
FIG. 1 illustrates a block diagram of various subsystems of a lithographic projection apparatus, according to an embodiment.

Scanner aberration impact modeling in a semiconductor manufacturing process is advantageous. The model(s) described herein may have a wide range of applications. Scanner aberration impact modeling may facilitate co-optimization of multiple scanners, controlling a scanner in-situ based on output from a model, and/or have other uses. The model(s) described herein comprise a hyperdimensional function configured to correlate received patterning system aberration data with new patterning process impact data. The hyperdimensional function is configured to correlate the received patterning system aberration data with the new patterning process impact data in an approximation form in lieu of a full simulation, without involving calculation of an aerial image or a representation thereof. This may save computation time, computing resources, and/or have other advantages.

For example, the nature of mirror heating and/or other dynamically changing variables that cause aberrations in a patterning process scanner (e.g., an EUV scanner) demands fast in-situ control in order to achieve stable imaging performance in production manufacturing environments. A prior attempt at this fast in-situ control included definition of a merit function based on pupil level properties (e.g., RMS of a delta wave front with respect to a reference state) of a scanner, but was unaware of the imaging performance properties on a substrate (e.g., wafer) level. As a consequence, although aberrations on the pupil level were minimized, the imaging performance (on the substrate or wafer level) was not optimized.

Alternative imaging performance based approaches are known, but these approaches are unsuitable for dynamic in-situ scanner control. For example, in one approach, calculation of the Zernike sensitivities of vast numbers of critical dimensions is required, which is computationally heavy and demands large online-offline data transfers. Using this approach, lithography performance metrics are limited to critical dimensions. This approach is not flexible enough to cover other types of custom metrics including discrete metrics (e.g. defect counts, etc.). As another example, a different approach involves a method for matching the performance of different scanners by performing aberration (wave front) optimization using a source mask optimization engine. However, this approach was designed for a cold lens setup without considering mirror heating and it performs an iterative optimization, which requires a full imaging simulation for every iteration. This is computationally heavy and unsuitable for dynamic in-situ scanner control.

Advantageously, the present disclosure describes systems and methods for performing fast and dynamic scanner aberration (wave front) control. These systems and methods are both imaging performance aware and suitable for dynamic in-situ scanner aberration control (e.g., such as for control of aberrations caused by mirror heating and/or other dynamic aspects of patterning equipment and/or a patterning process). The present systems and methods include a calibrated aberration impact model configured to receive patterning system aberration data and determine new patterning process impact data for the received patterning system aberration data. The model is calibrated with patterning system aberration calibration data and corresponding patterning process impact calibration data. In contrast to prior systems, the model comprises a relatively simple hyperdimensional function configured to correlate the received patterning system aberration data with the new patterning process impact data. The hyperdimensional function is configured to correlate the received patterning system aberration data with the new patterning process impact data in an approximation form in lieu of a full simulation. For example, in some embodiments, the model comprises a linear or quadratic algorithm. The new patterning process impact data from the model is configured (e.g., the output from the model is formatted) to be provided to a second model such as a projection optics correction model to facilitate dynamic in-situ aberration control of a patterning system (e.g., a scanner).

As another example, the same design layout (for a patterning process) may print differently on different scanners or at different slit locations, for example. This type of variation is detrimental because it cannot typically be fixed by optical proximity correction (OPC) or retargeting, unlike uniform printing errors. For prior systems, ensuring the same design layout printed the same on different scanners or at different slit locations requires full imaging simulations for each individual iteration. This is computationally heavy, and requires the identification of a reference scanner, which is often not an obvious choice for an operator (and thus can induce additional variation). Each scanner is individually matched to the reference scanner, but variation of critical features is not necessarily minimized.

Advantageously, the calibrated aberration impact model can be used for wavefront tuning (e.g., instead of the full imaging simulations in the prior art systems). As described above, the model comprises a relatively simple hyperdimensional function configured to correlate the received patterning system aberration data with the new patterning process impact data. The hyperdimensional function is configured to correlate the received patterning system aberration data with the new patterning process impact data in an approximation form in lieu of a full simulation (without calculation of an aerial image). Multiple models can be used to describe the imaging performance of multiple scanners. The model(s) described herein facilitate the adoption of a four component cost function to capture imaging performance, wavefront residual, and/or actuator consumption, among various other possibilities. In addition, the imaging performance can be arbitrarily specified by a user (instead of a hard scanner requirement). The model(s) described herein also facilitate using actuators as variables (e.g., instead of Zernikes), and use of a generic nonlinear optimizer (e.g., instead of a linear solver) to solve for optimal actuator positions for multiple scanners (e.g., instead of a single scanner).

Embodiments of the present disclosure are described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "projection optics," as used herein, should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the (e.g., semiconductor) patterning device, and/or optical components for shaping, adjusting and/or projecting the radiation after the radiation passes the patterning device. The projection optics generally exclude the source and the patterning device.

The (e.g., semiconductor) patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. The design rules may include and/or specify specific parameters, limits on and/or ranges for parameters, and/or other information. One or more of the design rule limitations and/or parameters may be referred to as a "critical dimension" (CD). A critical dimension of a device can be defined as the smallest width of a line or hole or the smallest space between two lines or two holes, or other features. Thus, the CD determines the overall size and density of the designed device. One of the goals in device fabrication is to faithfully reproduce the original design intent on the substrate (via the patterning device).

The term "mask" or "patterning device" as employed in this text may be broadly interpreted as referring to a generic semiconductor patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. An example of a programmable LCD array is given in U.S. Pat. No. 5,229,872, which is incorporated herein by reference.

As used herein, the term "patterning process" generally means a process that creates an etched substrate by the application of specified patterns of light as part of a lithography process. However, "patterning process" can also include plasma etching, as many of the features described herein can provide benefits to forming printed patterns using plasma processing.

As used herein, the term "target pattern" means an idealized pattern that is to be etched on a substrate.

As used herein, the term "printed pattern" means the physical pattern on a substrate that was etched based on a target pattern. The printed pattern can include, for example, troughs, channels, depressions, edges, or other two and three dimensional features resulting from a lithography process.

As used herein, the term "prediction model", "process model", and/or model (which may be used interchangeably) means a model that includes one or more models that simulate a patterning process. For example, a prediction and/or process model can include an optical model (e.g., that models a lens system/projection system used to deliver light in a lithography process and may include modelling the final optical image of light that goes onto a photoresist), a resist model (e.g., that models physical effects of the resist, such as chemical effects due to the light), and/or an OPC model (e.g., that can be used to make target patterns and may include sub-resolution resist features (SRAFs), etc.), and/or other models.

As used herein, the term "calibrating" means to modify (e.g., improve or tune) and/or validate something, such as the process model.

A patterning system may be a system comprising any or all of the components described above, plus other components configured to performing any or all of the operations associated with these components. A patterning system may include a lithographic projection apparatus, a scanner, and/or other systems, for example.

As an introduction, FIG. 1 illustrates a diagram of various subsystems of an example lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

It may be desirable to use one or more tools to produce results that, for example, can be used to design, control, monitor, etc. the patterning process. One or more tools used in computationally controlling, designing, etc. one or more aspects of the patterning process, such as the pattern design for a patterning device (including, for example, adding sub-resolution assist features or optical proximity corrections), the illumination for the patterning device, etc., may be provided. Accordingly, in a system for computationally controlling, designing, etc. a manufacturing process involving patterning, the manufacturing system components and/or processes can be described by various functional modules and/or models. In some embodiments, one or more electronic (e.g., mathematical, parameterized, etc.) models may be provided that describe one or more steps and/or apparatuses of the patterning process. In some embodiments, a simulation of the patterning process can be performed using one or more electronic models to simulate how the patterning process forms a patterned substrate using a design pattern provided by a patterning device.

Figure 2:
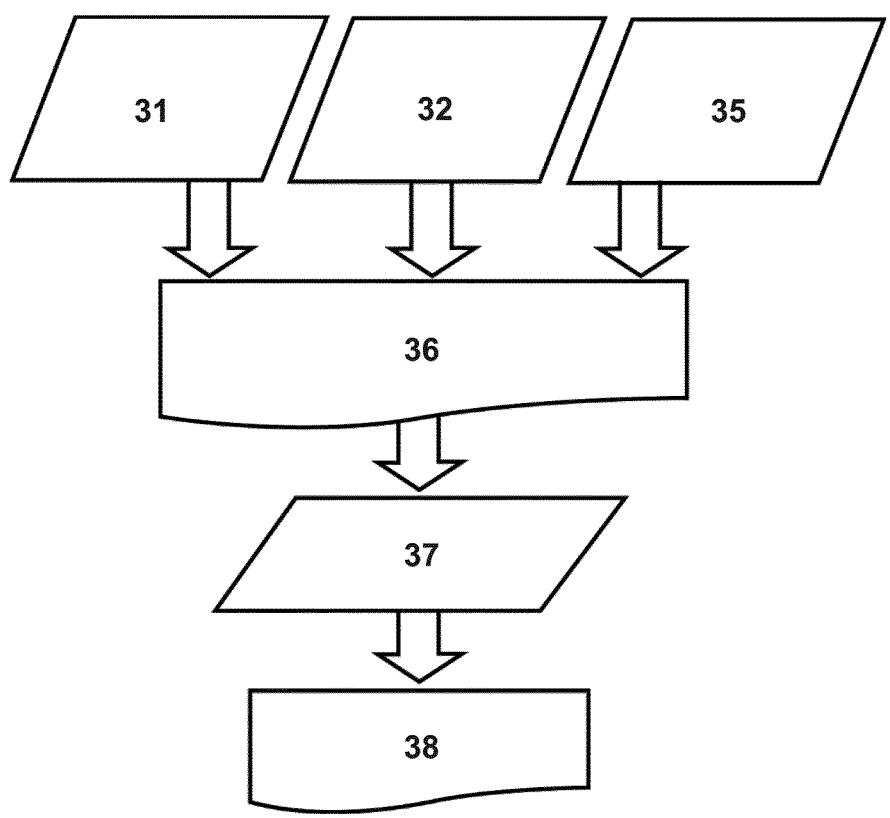
FIG. 2 illustrates an exemplary flow chart for fully simulating lithography in a lithographic projection apparatus, according to an embodiment.

An exemplary flow chart for simulating lithography in a lithographic projection apparatus is illustrated in FIG. 2. This may be an exemplary full lithography simulation. An illumination model 31 represents optical characteristics (including radiation intensity distribution and/or phase distribution) of the illumination. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated using the illumination model 31, the projection optics model 32, and the design layout model 35. A resist image 38 can be simulated from the aerial image 36 using a resist model 37. Simulation of lithography can, for example, predict contours and/or CDs in the resist image.

More specifically, illumination model 31 can represent the optical characteristics of the illumination that include, but are not limited to, NA-sigma (σ) settings as well as any particular illumination shape (e.g. off-axis illumination such as annular, quadrupole, dipole, etc.). The projection optics model 32 can represent the optical characteristics of the of the projection optics, including, for example, aberration, distortion, a refractive index, a physical size or dimension, etc. The design layout model 35 can also represent one or more physical properties of a physical patterning device, as described, for example, in U.S. Pat. No. 7,587,704, which is incorporated by reference in its entirety. Optical properties associated with the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics (hence design layout model 35).

The resist model 37 can be used to calculate the resist image from the aerial image, an example of which can be found in U.S. Pat. No. 8,200,468, which is hereby incorporated by reference in its entirety. The resist model is typically related to properties of the resist layer (e.g., effects of chemical processes which occur during exposure, post-exposure bake and/or development).

One of the objectives of the full simulation is to accurately predict, for example, edge placements, aerial image intensity slopes and/or CDs, which can then be compared against an intended design. The intended design is generally defined as a pre-OPC design layout which can be provided in a standardized digital file format such as GDS, GDSII, OASIS, or other file formats.

From the design layout, one or more portions may be identified, which are referred to as "clips." In an embodiment, a set of clips is extracted, which represents the complicated patterns in the design layout (typically about 50 to 1000 clips, although any number of clips may be used). As will be appreciated by those skilled in the art, these patterns or clips represent small portions (e.g., circuits, cells, etc.) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips often contain one or more test patterns or gauge patterns. An initial larger set of clips may be provided a priori by a customer based on known critical feature areas in a design layout which require particular image optimization. Alternatively, in another embodiment, the initial larger set of clips may be extracted from the entire design layout by using an automated (such as, machine vision) or manual algorithm that identifies the critical feature areas.

For example, the simulation and modeling can be used to configure one or more features of the patterning device pattern (e.g., performing optical proximity correction), one or more features of the illumination (e.g., changing one or more characteristics of a spatial/angular intensity distribution of the illumination, such as change a shape), and/or one or more features of the projection optics (e.g., numerical aperture, etc.). Such configuration can be generally referred to as, respectively, mask optimization, source optimization, and projection optimization. Such optimization can be performed on their own, or combined in different combinations. One such example is source-mask optimization (SMO), which involves the configuring of one or more features of the patterning device pattern together with one or more features of the illumination. The optimization techniques may focus on one or more of the clips. The optimizations may use the machine learning model described herein to predict values of various parameters (including images, etc.).

In some embodiments, an optimization process of a system may be represented as a cost function. The optimization process may comprise finding a set of parameters (design variables, process variables, etc.) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics. The cost function can also be the maximum of these deviations (i.e., worst deviation). The term "evaluation points" should be interpreted broadly to include any characteristics of the system or fabrication method. The design and/or process variables of the system can be confined to finite ranges and/or be interdependent due to practicalities of implementations of the system and/or method. In the case of a lithographic projection apparatus, the constraints are often associated with physical properties and characteristics of the hardware such as tunable ranges, and/or patterning device manufacturability design rules. The evaluation points can include physical points on a resist image on a substrate, as well as non-physical characteristics such as dose and focus, for example.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N)$$

where $(z_1, z_2, \ldots, z_N)$ are N design variables or values thereof, and $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. In some embodiments, $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in the equation above and $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In some embodiments, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. The parameters (e.g., design variables) can include any adjustable parameter such as an adjustable parameter of the source, the patterning device, the projection optics, dose, focus, etc.

The parameters (e.g., design variables) may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. Constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

In some embodiments, illumination model 31, projection optics model 32, design layout model 35, resist model 37, and/or other models associated with and/or included in an integrated circuit manufacturing process may be an empirical model that performs the operations of the method described herein. The empirical model may predict outputs based on correlations between various inputs (e.g., one or more characteristics of a mask or wafer image, one or more characteristics of a design layout, one or more characteristics of the patterning device, one or more characteristics of the illumination used in the lithographic process such as the wavelength, etc.).

As an example, the empirical model may comprise one or more algorithms. As another example, the empirical model may be a machine learning model and/or any other parameterized model. In some embodiments, the machine learning model (for example) may be and/or include mathematical equations, algorithms, plots, charts, networks (e.g., neural networks), and/or other tools and machine learning model components. For example, the machine learning model may be and/or include one or more neural networks having an input layer, an output layer, and one or more intermediate or hidden layers. In some embodiments, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function that combines the values of all its inputs together. In some embodiments, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In some embodiments, the one or more neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for the one or more neural networks may be freer flowing, with connections interacting in a more chaotic and complex fashion. In some embodiments, the intermediate layers of the one or more neural networks include one or more convolutional layers, one or more recurrent layers, and/or other layers.

The one or more neural networks may be trained (i.e., whose parameters are determined) using a set of training information. The training information may include a set of training samples. Each sample may be a pair comprising an input object (typically a vector, which may be called a feature vector) and a desired output value (also called the supervisory signal). A training algorithm analyzes the training information and adjusts the behavior of the neural network by adjusting the parameters (e.g., weights of one or more layers) of the neural network based on the training information. For example, given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network g: X→Y, where X is the input space and Y is the output space. A feature vector is an n-dimensional vector of numerical features that represent some object (e.g., a simulated aerial image, a wafer design, a clip, etc.). The vector space associated with these vectors is often called the feature space. After training, the neural network may be used for making predictions using new samples.

The present systems and methods include a calibrated model configured to predict the impact a patterning system (e.g., a scanner) aberration may have on a patterning process. The calibrated model may be referred to as an aberration impact model herein, for example. The aberration impact model is configured to receive patterning system aberration data (e.g., data that describes the characteristics of a particular aberration) and determine new patterning process impact data (e.g., data that describes the effect the aberration has on a corresponding patterning process result) for the received patterning system aberration data. The aberration impact model is calibrated with patterning system aberration calibration data and corresponding patterning process impact calibration data. In contrast to prior systems, the aberration impact model comprises a relatively simple hyperdimensional function configured to correlate the received patterning system aberration data with the new patterning process impact data. The hyperdimensional function is configured to correlate the received patterning system aberration data with the new patterning process impact data in a simplified form in lieu of a full simulation. For example, the aberration impact model may comprise a linear or quadratic algorithm. As described above, a full simulation may include simulation of a source, a mask, a dose, a focus, and/or other aspects of a lithography process (e.g., see FIG. 2). Modelling with the aberration impact model in lieu of a full simulation comprises at least modelling without generation or simulation, or otherwise calculation of an aerial image representation. The aberration impact model is configured to generate predictions based on input the pattering system aberration data, without the need for other information related to the source, the mask, the dose, the focus, etc., that would be needed in a full simulation.

The new patterning process impact data from the model can be (e.g., the output from the model is formatted) provided to a second model such as a projection optics correction model to enable dynamic in-situ aberration control of a patterning system, e.g., aberration caused by mirror heating in a EVU lithography system or lens heating in a DUV lithography system. Advantageously, this facilitates fast and dynamic scanner aberration (and wave front) control that is imaging performance aware (e.g., such as for control of aberrations caused by mirror heating and/or other dynamic aspects of patterning equipment and/or a patterning process).

Figure 3:
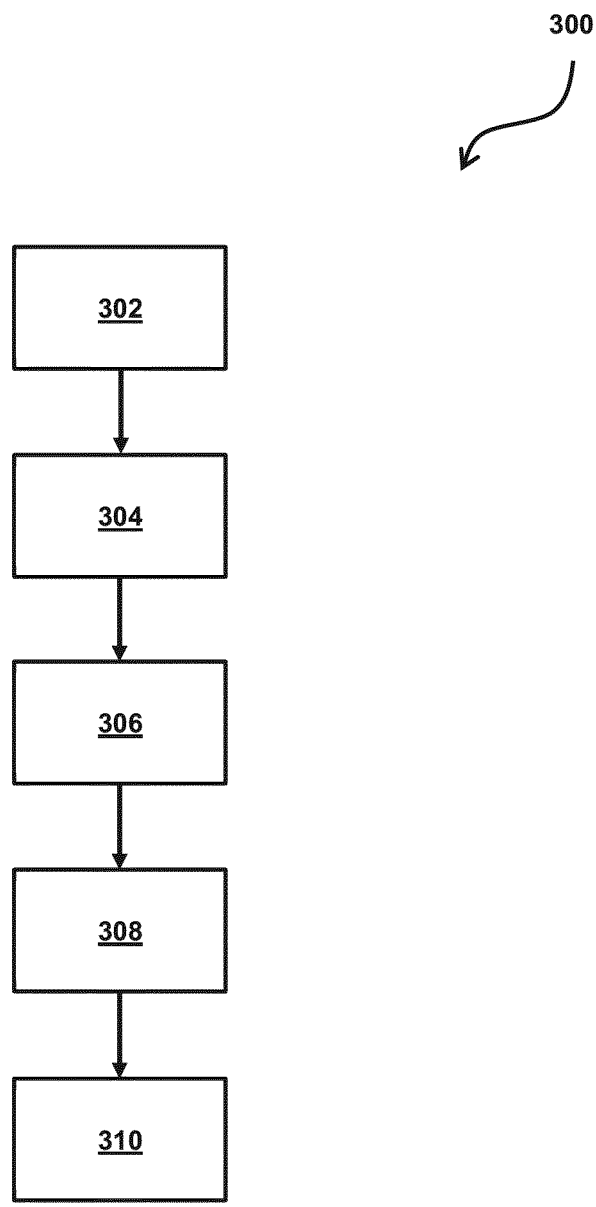
FIG. 3 illustrates a present method, according to an embodiment.

FIG. 3 illustrates an exemplary method 300 according to an embodiment of the present disclosure. In some embodiments, method 300 comprises calibrating 302 the aberration impact model, receiving 304 patterning system aberration data, predicting and/or otherwise determining 306 patterning process impact data, providing 308 the patterning process impact data to a second model, performing 310 dynamic in-situ aberration control of a patterning system, and/or other operations. The operations of method 300 presented below are intended to be illustrative. In some embodiments, method 300 may be accomplished with one or more additional operations not described, and/or without one or more of the operations discussed. For example, operations 308, 310, and/or other operations may be optional. Additionally, the order in which the operations of method 300 are illustrated in FIG. 3 and described below is not intended to be limiting.

At operation 302, the aberration impact model is calibrated. The aberration impact model may be a prediction model, for example. Calibration may include model generation, training, tuning, and/or other operations. The model is calibrated with patterning system aberration calibration data and corresponding patterning process impact calibration data. The patterning system may be and/or include a scanner (such as the lithographic projection apparatus shown in FIG. 1 and in later figures). In a scanner, an aberration may occur when the surface of a lens element (e.g., a lens, a mirror, and/or other elements) in a scanner is not in an intended position. The surface of the lens element may not be in an intended position because of lens element heating, for example, but may have many different causes. Patterning system aberration data includes data that describes the characteristics of a particular aberration, causes of the aberration, and/or other data. Patterning system aberration data may include measured and/or simulated aberrations, system and/or process parameters associated with an aberration, and/or other wavefront information. A wavefront aberration (or "aberration" as used herein) may refer to a deviation (degree of disagreement) between an ideal wavefront and an actual wavefront.

For example, when a lens element heats up, shape changes (which cause aberrations) may be caused by a laser power level, a pupil shape, a target design, an exposure dose, and/or other factors. Any and/or all of these and other factors may be included in a patterning system aberration data set. Patterning process impact data includes data that describes the effect an aberration has on a corresponding patterning process. For example, patterning process impact data may be indicative of an impact, by a corresponding patterning system aberration, on imaging performance on a substrate, for example a critical dimension, a pattern placement error, an edge placement error, critical dimension asymmetry, a best focus shift, a defect count associated with a patterning process, and/or other parameters. Patterning process impact data may include values for various parameters, cost and/or merit functions (e.g., as described below), and/or other information.

Patterning system aberration calibration data and corresponding patterning process impact calibration data comprise known and/or otherwise previously determined data. The patterning system aberration and/or process impact calibration data may be measured, simulated, and/or determined in other ways. In some embodiments, the calibration data is obtained by executing a full simulation model based on associated pupil shapes, patterning device designs, and various aberration inputs (e.g., where the full simulation model may include one or more of illumination model 31, projection optics model 32, design layout model 35, resist model 37, and/or other models).

In some embodiments, the aberration impact model is calibrated by providing the patterning system aberration calibration data to a base (prediction) model to obtain a prediction of the patterning process impact calibration data, and using the patterning process impact calibration data as feedback to update one or more configurations of the base model. For example, the one or more configurations of the aberration impact are updated based on a comparison between the patterning process impact calibration data and the prediction of the patterning process impact calibration data. The calibration data used for calibrating the aberration impact model may include pairs or sets of inputs (e.g., known patterning system aberration data) and corresponding known outputs (e.g., known patterning process impact calibration data). In some embodiments, the aberration impact model may self-learn using the provided pairs of training information. A calibrated aberration impact model can then be used to make predictions (e.g., on patterning process impact) based on various input information such as different patterning system aberration data as described above.

In some embodiments, the aberration impact model comprises a hyperdimensional function configured to correlate the received patterning system aberration data with patterning process impact data. In some embodiments, calibrating the model comprises updating one or more configurations of the base model by tuning and/or otherwise adjusting one or more parameters of the function. In some embodiments, tuning comprises adjusting one or more model parameters such that predicted patterning process impact data better matches, or better corresponds to, known patterning process impact calibration data. In some embodiments, tuning comprises training or re-training the model using additional calibration information comprising new and/or additional input/output calibration data pairs.

In some embodiments, the aberration impact model (e.g., the hyperdimensional function) comprises one or more of a non-linear algorithm, a linear algorithm, a quadratic algorithm, or a combination thereof but can and/or include any suitable arbitrary mathematical function. For example, the hyperdimensional function may have any arbitrary power polynomial form, a piece-wise polynomial form, exponential forms, Gaussian forms, sigmoid forms, decision-tree type of forms, convolutional neural network type of forms, etc. These algorithms may include any number of parameters, weights, and/or other features, in any combination such that the hyperdimensional function is configured to mathematically correlate patterning system aberrations with patterning process impact in a simplified form in lieu of a full simulation. Without limiting the scope of the present disclosure to the following examples, an example linear algorithm may include linear forms of Zernike terms, where the linear coefficients are computed via a linear regression of the dependency of CD, PPE, EPE, asymmetry, defects, and/or other parameters on individual Zernike terms. An example quadratic algorithm may include linear and quadratic forms of Zernike terms, where the linear and quadratic coefficients are computed via a non-linear regression of the dependency of CD, PPE, and/or other parameters on individual Zernike terms.

In some embodiments, the form of the function (e.g., non-linear, linear, quadratic, etc.), the parameters of the function, the weights in the algorithm, and/or other characteristics of the function may be determined automatically based on the calibration described above, based on accuracy and runtime performance specifications provided by a user, based on manual entry and/or selection of information by a user through a user interface included in the present system, and/or by other methods. In some embodiments, the form of the function (e.g., non-linear, linear, quadratic, etc.), the parameters of the function, and/or other characteristics of the function may change with individual layers of a substrate (e.g., as processing parameters and/or other conditions that might cause and/or affect aberrations change), and/or based on other information. For example, different models may be calibrated for different layers of a substrate produced during semiconductor device manufacturing pattering operations.

Figure 4:
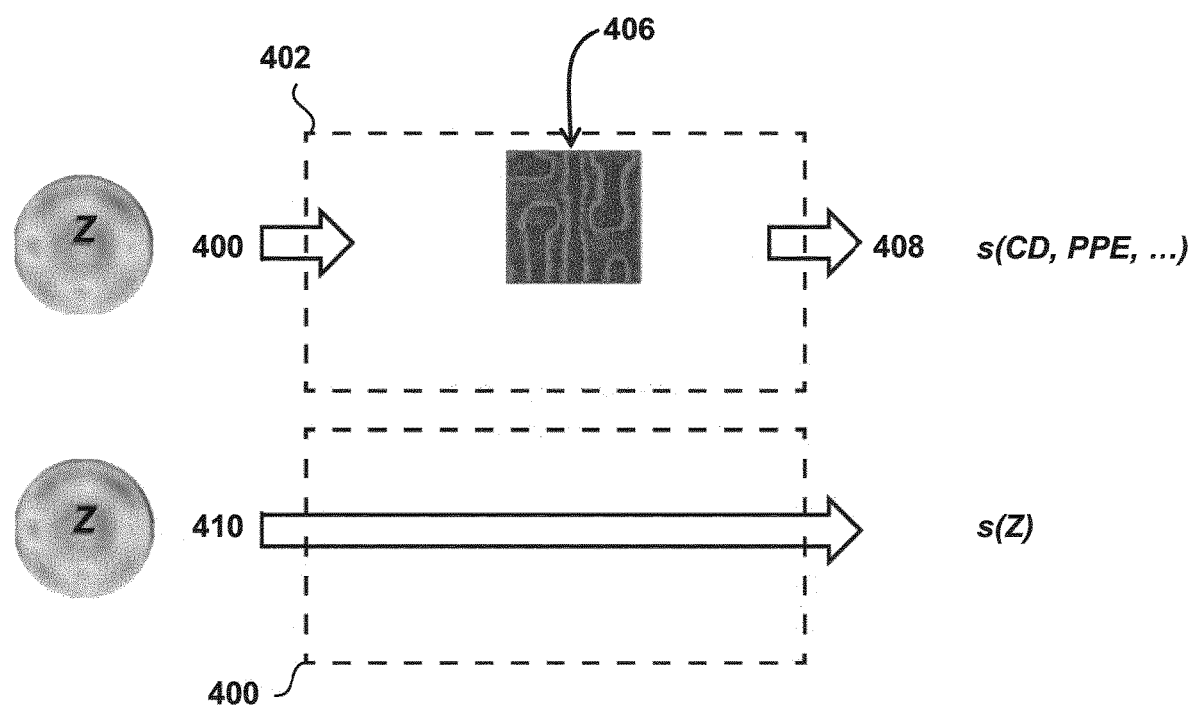
FIG. 4 illustrates operation of a present aberration impact model compared to a full simulation, according to an embodiment.

A full simulation model is typically computationally expensive and time-consuming, and therefore not suitable for processing real-time aberration drift to allow compensation during high volume manufacturing. By way of a non-limiting example, FIG. 4 illustrates operation of the present aberration impact model 400 compared to a full simulation 402. As described above, a full simulation may include simulation of a source, a mask, a dose, a focus, and/or other aspects of a lithography process (e.g., see FIG. 2). Modelling with the present aberration impact model in lieu of a full simulation comprises at least modelling without calculation (e.g., simulation or generation) of an aerial image or its representation The aberration impact model is configured to generate predictions based on input the pattering system aberration data, without the need for other information related to the source, the mask, the dose, the focus, etc., that would be needed in a full simulation.

As shown in FIG. 4, prior to invention of the present systems and methods, a measured, modeled, and/or otherwise determined aberration Z (e.g., defined by patterning system aberration data) was used 404 for a full lithographic simulation 406. Full lithographic simulation 406 was then be used to evaluate 408 lithography process costs (e.g., defined by and/or comprising patterning process impact data). Depending on application-specific use cases, a user may have elect to focus on different lithography performance metrics, such as CD, PPE, EPE, CD asymmetry, defect counts, etc. A cost (merit) function s(CD, PPE, . . . ) was defined according to user requirements. For any given aberration Z, a full lithographic simulation was performed to obtain CD, PPE, EPE, and then evaluate s(CD, PPE, . . . ). Full lithographic simulation is slow and expensive. Iteratively repeating such simulation is thus inappropriate for dynamic in-situ aberration control. In contrast, aberration impact model 400 can be applied much faster than a full simulation at least because it is less computationally intensive. For example, as shown in FIG. 4, process costs may be modeled 410 and defined directly as a function of an aberration (e.g., s(Z) as shown). The function s(Z) may indicate impact on a patterning process as a function of aberration. Embodiments of the present disclosure are described in great detail with reference to aberration and aberration correction. For example, as discussed herein a wavefront aberration may refer to a deviation (degree of disagreement) between an ideal wavefront and an actual wavefront. However, the mechanism disclosed herein can be applied to other wavefront aspects monitoring or correction in the lithography process without departing from the scope of the present disclosure.

Figure 5:
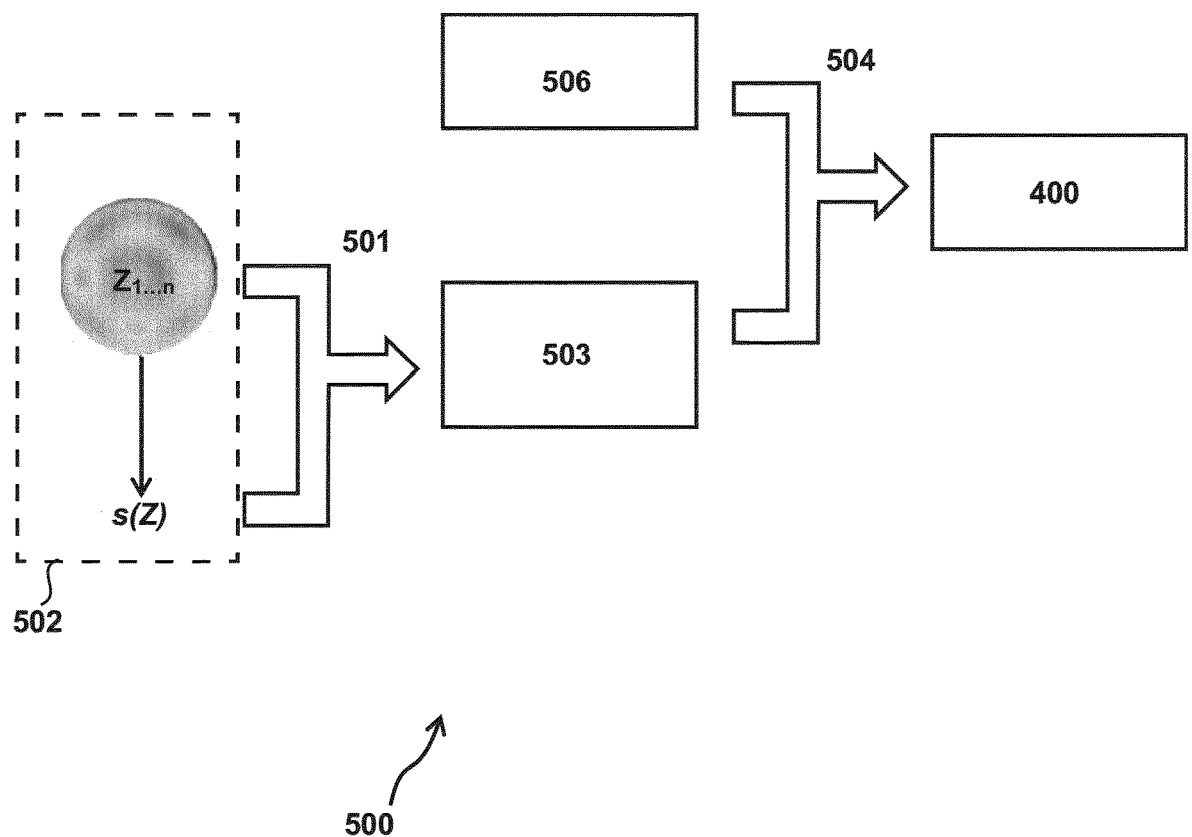
FIG. 5 illustrates example operations for building the present aberration impact model, according to an embodiment.

As another non-limiting example, FIG. 5 illustrates example operations 500 for building the present aberration impact model 400. As described above, calibration data 503 may be generated 501 based on repeated simulations 502 of different aberrations (e.g., $Z_1 \ldots Z_n$) and the impacts the different aberrations have on a patterning process, where the impacts may be represented by a comprehensive cost function s(Z). Calibration data 503 is used to calibrate 504 a base model 506 (e.g., having a determined form—linear, quadratic, etc.) to produce aberration impact model 400.

Returning to FIG. 3, at operation 304, patterning system aberration data is received by the aberration impact model. The received patterning system aberration data may include data that describes the characteristics of a particular aberration, causes of the aberration, and/or other data. Patterning system aberration data may include measured and/or simulated aberrations, system and/or process parameters associated with an aberration, and/or other information. The data is received by the model as input for generating a prediction. The data may be received electronically from one or more other portions of the present system (e.g., from a different processor), from a remote computing system not associated with a present system, and/or from other sources. The data may be received wireless and/or via wires, via a portable storage medium, and/or from other sources. The data may be uploaded and/or downloaded from another source, such as cloud storage for example, and/or received in other ways.

In some embodiments, the patterning system aberration data is received during manufacturing of a substrate. For example, aberration drift may be measured (e.g., and/or the patterning system aberration data may be determined) during or just prior to processing a layer of a substrate in a semiconductor manufacturing process. The relatively time-consuming and computationally intensive configuration and calibration of the aberration impact model is accomplished prior to its utilization in high volume manufacturing. The calibrated model has a simplified form without involving utilization of illumination model 31, projection optics model 32, design layout model 35, resist model 37, or other models to make predictions, which advantageously enabling real-time or near real time calculation to obtain accurate compensation for scanner (patterning system) aberrations. Further, since the calibrated model can be configured to optimize one or imaging performance factors with respect to the substrate, the determined aberration compensation can advantageously result in optimal imaging performance on the substrate.

Figure 6:
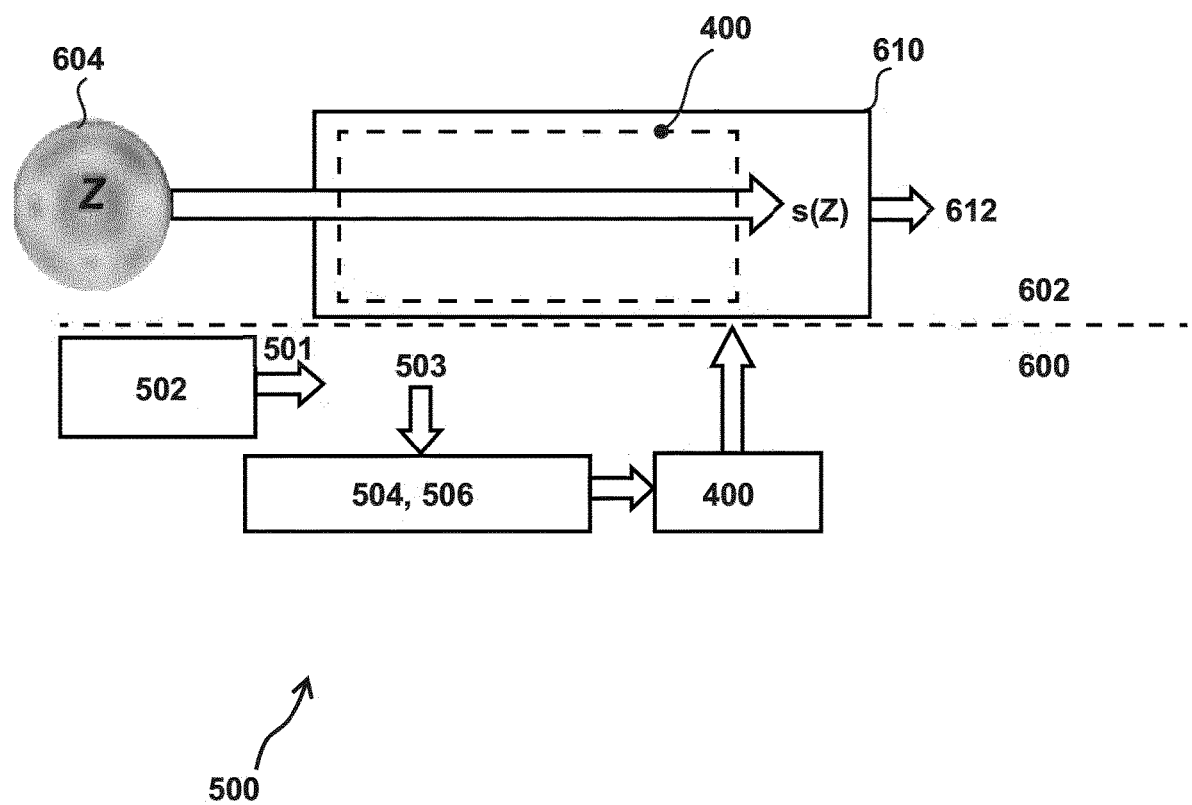
FIG. 6 illustrates building the present aberration impact model (e.g., the operations shown in FIG. 5) during an offline or research and development phase, and then using the model in a manufacturing phase, according to an embodiment.

By way of a non-limiting example, FIG. 6 illustrates building (using operations 500) of aberration impact model 400 (e.g., the operations shown in FIG. 5) during an offline or research and development phase 600, and then using model 400 in a high volume manufacturing phase 602. As shown in FIG. 5, in manufacturing phase 602, model 400 is configured to receive measured aberration 604 data (e.g., patterning system aberration data) and output new patterning process impact data s(Z). In some embodiments, the aberration impact model does not need to "output" imaging performance data. As described below, the output from model 400 (e.g., s(Z)) (and/or calculation results that are not "output" by the model) is configured to be used by a second model 610 to facilitate dynamic in-situ scanner aberration control 612. However, this is merely exemplary. In some other embodiments, the aberration impact model integrates the functions of the second model.

Returning to FIG. 3, at an operation 306, patterning process impact data is determined in response to the received patterning system aberration data. The new patterning process impact data is determined based on the aberration impact model and/or other information. The generated patterning process impact data is indicative of an impact with respect to the substrate, by a corresponding patterning system aberration, on one or more of a critical dimension, a pattern placement error, an edge placement error, critical dimension asymmetry, a best focus shift, a defect count associated with a patterning process, and/or other parameters of a patterning process. In some embodiments, determining the new patterning process impact data comprises predicting the new patterning process impact data by the aberration impact model. The patterning process impact data is predicted based on the received patterning system aberration data (e.g., a measured aberration in real time during high volume manufacturing). In some embodiments, the predicted patterning process impact data indicates a high probability or likelihood that a given aberration will cause the corresponding patterning process impact.

In some embodiments, the aberration impact model comprises a value of a cost (or merit) function for a corresponding patterning system aberration, $s(Z)$. The cost function $s(Z)$ is indicative of an impact on the patterning process (e.g., on any one or more of the parameters listed above) caused by the corresponding patterning system aberration drift. In some embodiments, the aberration drift is primarily caused by lens heating or mirror heating during operations of the lithography apparatus. The cost (or merit) function $s(Z)$ determined by the aberration impact model may include parameters associated with scanner tuning knobs, lithography performance metrics (e.g., as chosen by a user—CD, EPE, defect count, asymmetry parameters, etc.), and/or other parameters (see examples and discussion provided below associated with operations 308 and 310, and FIGS. 7-9).

In some embodiments, method 300 includes providing 308 the new patterning process impact data to a second model to facilitate dynamic in-situ aberration control of a patterning system (e.g., a scanner). Providing the new patterning process impact data includes providing the cost function $s(Z)$, for example, and/or other information. In some embodiments, the second model is a projection optics correction model, and/or other models. In some embodiments, the new patterning process impact data (e.g., the cost function) from the aberration impact model is configured to be used (e.g., by the projection optics correction model) to determine a set of patterning process control metrics. In some embodiments, the patterning process control metrics comprise lithography performance metrics, and/or other information. In some embodiments, the set of patterning process control metrics is configured to be determined by a linear solver and/or by other operations.

In some embodiments, method 300 includes performing 310 dynamic in-situ aberration control of a patterning system (e.g., a scanner and/or other patterning systems). In some embodiments, dynamic in-situ control of the scanner comprises generating a corrected scanner control parameter recipe for a given scanner aberration to optimize a set of lithography performance metrics. In some embodiments, dynamic in-situ control comprises control aberration during high volume manufacturing. For example, in some embodiments, operations 302-310 may be performed such that the new patterning process impact data (e.g., the cost function output by the aberration impact model) is configured to facilitate enhanced compensation for, and/or control over, (e.g., EUV) heating of one or more mirrors, lenses, and/or other elements of the patterning system (e.g., to reduce and/or eliminate scanner aberrations) in real time or near real time during manufacturing. EUV mirror heating control is useful because a scanner typically needs to use a limited number of knobs to dynamically correct for an aberration induced by mirror heating. As another example, operations 302-310 may be performed such that the new patterning process impact data (e.g., the cost function output by the aberration impact model) is configured to facilitate enhanced control of a focus, a dose, and/or stage variation (MSD) associated with the patterning system (e.g., the scanner) in real time or near real time during manufacturing. Other examples are contemplated.

It should be noted that one aberration impact model can be provided to different projection optics boxes for control of CD, EPE, and/or other parameters. Because the aberration impact model may be configured such that the cost (merit) function is constructed from a simulation result, one can define (e.g., use for calibration) any desired metrics, such as CD, pattern placement error (PPE), EPE, CD asymmetry, best focus shift, defect count, etc. In this way, the present aberration-impact model may be configured to automatically reflect desired metrics.

Figure 7:
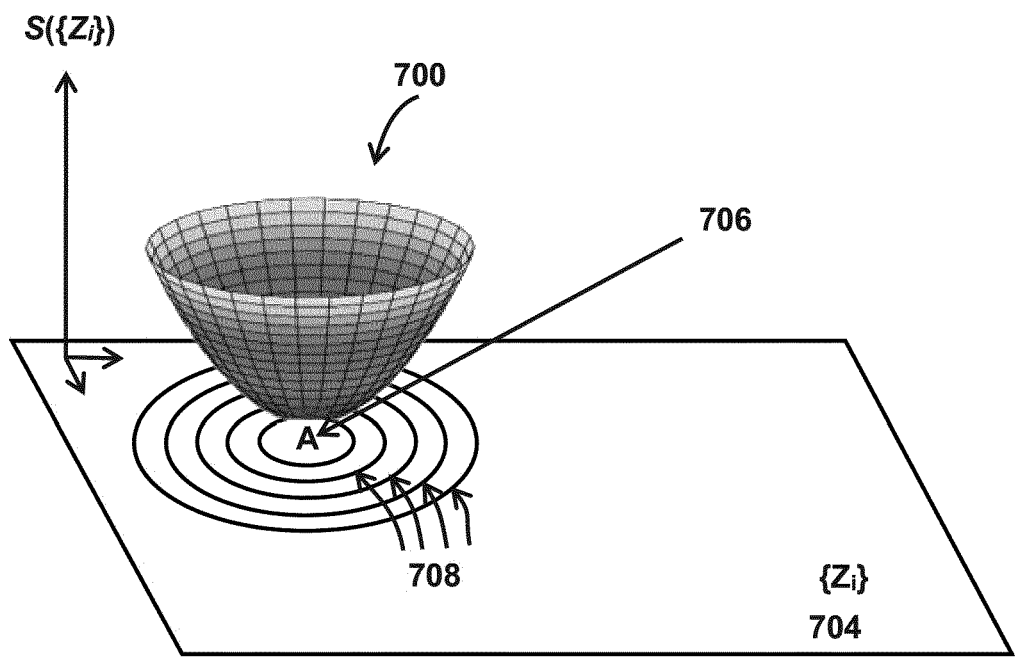
FIG. 7 illustrates an example of configuring a cost function from the aberration impact model for use by a projection optics correction model to determine a set of patterning process control metrics, according to an embodiment.

By way of several non-limiting examples, FIGS. 7-11 illustrate various operations included in providing (e.g., operation 308) the new patterning process impact data to a second model to facilitate dynamic in-situ aberration control of a scanner (e.g., operation 310). For example, FIG. 7 illustrates an example of configuring the cost function from the aberration impact model for use by the projection optics correction model to determine the set of patterning process control metrics. FIG. 7 provides a visual illustration 700 of a cost function 702 in an aberration (or wavefront aberration) space 704. FIG. 7 illustrates a target state (or an initial or cold state of a scanner) "A" 706, and iso-cost curves 708. As described above, the aberration impact model determines cost function $s(Z)$ 702. The projection optics correction model defines a (scanner) lens (element—e.g., lens, mirror, etc.) dependence matrix D such that a scanner performance fingerprint=D*δ, where S represents variable scanner control knob settings. In some embodiments, the cost function from the aberration impact model may be defined as:

$$s(Z(\delta))=s(\Delta Z+D\delta)$$

where ΔZ represents an aberration drift from the scanner, D is the dependency matrix, δ represents the variable scanner control knob settings, and Dδ represents the performance fingerprint (or in other words an indication of a needed correction). A non-linear optimizer may be used to minimize $s(\delta)$ such that $\delta^*=\text{argmin } s(\delta)$, where δ* represents a needed dynamic scanner knob correction.

Figure 8:
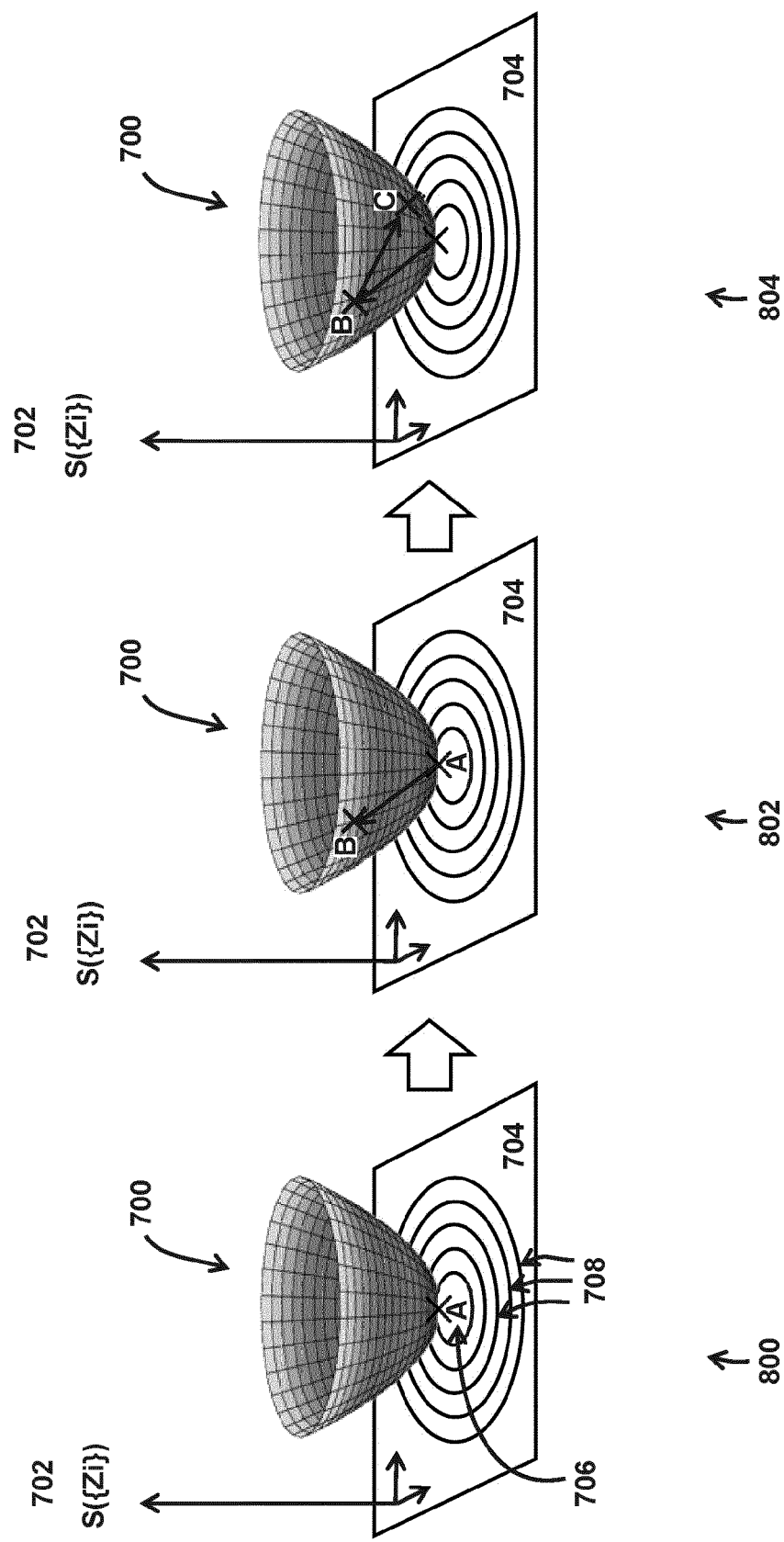
FIG. 8 illustrates dynamic aberration control (using mirror heating as an example), according to an embodiment.

Continuing with visual illustration 700 shown in FIG. 7, FIG. 8 illustrates dynamic aberration control/correction (using (lens) mirror heating as an example). FIG. 8 illustrates an attempt by the projection optics correction model to correct for a scanner aberration based on the cost function determined by the aberration impact model. FIG. 8 illustrates cold state A 706 in view 800 (before a mirror has begun to heat during scanner operation), a hot state B in view 802 (after the mirror has heated during scanner operation), and a hot state after correction C in view 804. In cold state A, ΔZ=0, and δ=0. The cost function $s(Z(\delta))$ is at its minimum, s=0. In the hot state before correction B, $\Delta Z \neq 0$, and $\delta=0$. The cost function $s=\Delta Z^T H \Delta Z$, where H is a cost function Hessian, and T represents a transpose operation. In the hot state after correction C, $\Delta Z \neq 0$, and $\delta \neq 0$. The projection optics correction model is trying to adjust knobs ($\delta$) in an effort to minimize the cost $s(\delta)$.

As described above, in some embodiments, the new patterning process impact data (e.g., the cost function) from the aberration impact model is configured to be used (e.g., by the projection optics correction model) to determine a set of patterning process control metrics. In some embodiments, the patterning process control metrics comprise lithography performance metrics (or "lithography metrics"), and/or other information. In some embodiments, the set of patterning process control metrics is configured to be determined by a linear solver and/or by other operations. For example, assume (for this example) the form of the aberration-impact model (and/or the cost function output by the aberration impact model) is a positive-definite quadratic such as:

$$s(Z) = \frac{1}{2} Z^T H Z = \frac{1}{2} \sum_{ij} h_{ij} Z_i Z_j$$

where the total aberration $Z=\Delta Z+D\delta$, $\Delta Z$ is the aberration drift (e.g. aberration induced by mirror heating), and $\delta$ represents the scanner knobs and $D\delta$ represents the correction. Then:

$$s(\delta) = \frac{1}{2}(\Delta Z + D\delta)^T H (\Delta Z + D\delta).$$

The above cost function can be converted into a set of lithography metrics. In some embodiments, the new patterning process impact data from the model comprises a cost function Hessian (e.g., H in the equation(s) above). Determining the set of patterning process control metrics comprises performing a singular value decomposition (SVD) on the Hessian. The Hessian (H) is a positive-definite matrix. Performing SVD on the Hessian converts the cost function it into the format of a "lithometric".

Figure 9:
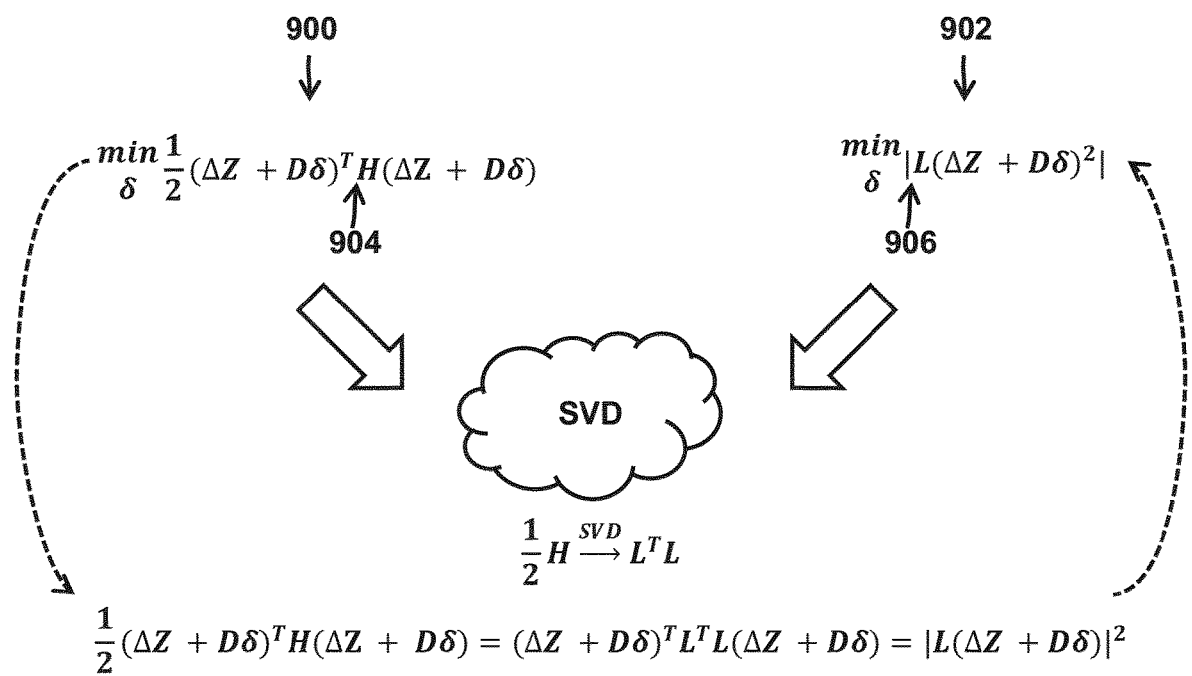
FIG. 9 illustrates converting a cost function (from the aberration impact model) into the format of a lithometric (e.g., to facilitate determination of a set of patterning process control metrics by a projection optics correction model), according to an embodiment.

For example, FIG. 9 illustrates converting a cost function (from the aberration impact model) into the format of a lithometric (e.g., to facilitate determination of a set of patterning process control metrics by the projection optics correction model). FIG. 9 illustrates what is to be achieved 900 compared to what a projection optics correction model can typically do 902. In some embodiments, "what is to be achieved" is minimization of a lithography merit function as previously defined; "what a projection optics model can typically do" is to achieve certain targets for a set of linear combination of Zernike variables, in an RMS sense. FIG. 9 illustrates a cost function Hessian 904 and a lithometric 906. To bridge the gap between the two expressions, a singular value decomposition (SVD) may be performed on the Hessian according to the equation:

$$\frac{1}{2} H \xrightarrow{SVD} L^T L$$

(where the Eigenvalues are absorbed into the Eigenvectors) such that:

$$\frac{1}{2}(\Delta Z + D\delta)^T H (\Delta Z + D\delta) = (\Delta Z + D\delta)^T L^T L (\Delta Z + D\delta) = |L(\Delta Z + D\delta)|^2$$

as shown in FIG. 9. SVD essentially eliminates cross terms via a high-dimensional rotation.

Figure 10:
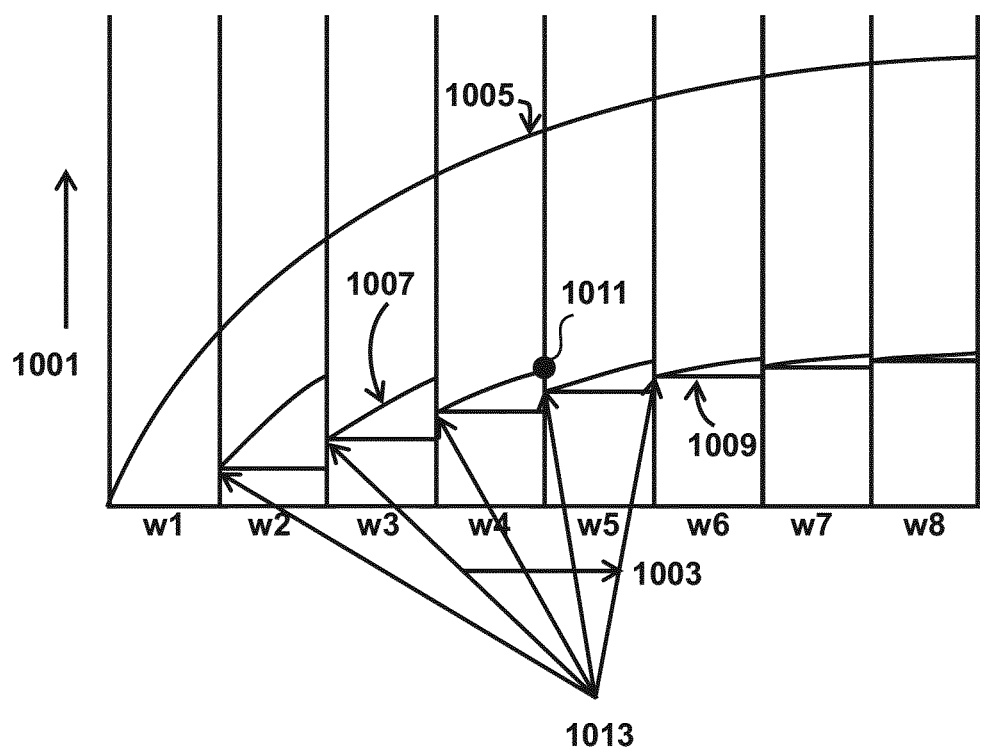
FIG. 10 illustrates how the present aberration impact model can enable per-substrate (e.g., per wafer or even per layer) dynamic aberration correction, according to an embodiment.

FIG. 10 illustrates how the present aberration impact model can enable per-substrate (e.g., per wafer or per layer) dynamic aberration correction. FIG. 10 uses mirror heating as an example. FIG. 10 plots aberration (e.g., Zernike$_i$) 1001 over time (in a given production lot) 1003 caused by mirror heating. Wafers 1-8 (w1, w2, ..., w8) for a production lot are shown in FIG. 10. FIG. 10 plots a raw 1005 aberration drift (e.g., change in Zernike 1001 over time 1003 caused by mirror heating) that would occur without correction. In contrast, FIG. 10 also shows, for each wafer, a mirror heating residual 1007, a projection optics correction model residual 1009, a last field 1011 (which is equal to a worst mirror heating residual) for mirror heating residual 1007, and a correction 1013. The correction is applied by the projection optics correction model as described above. Due to the dynamic nature of the aberration impact model, corrections can be applied on a per-wafer basis, in contrast to prior art systems, which provided a static correction that can only be performed offline (e.g., not in a production manufacturing setting).

Figure 11:
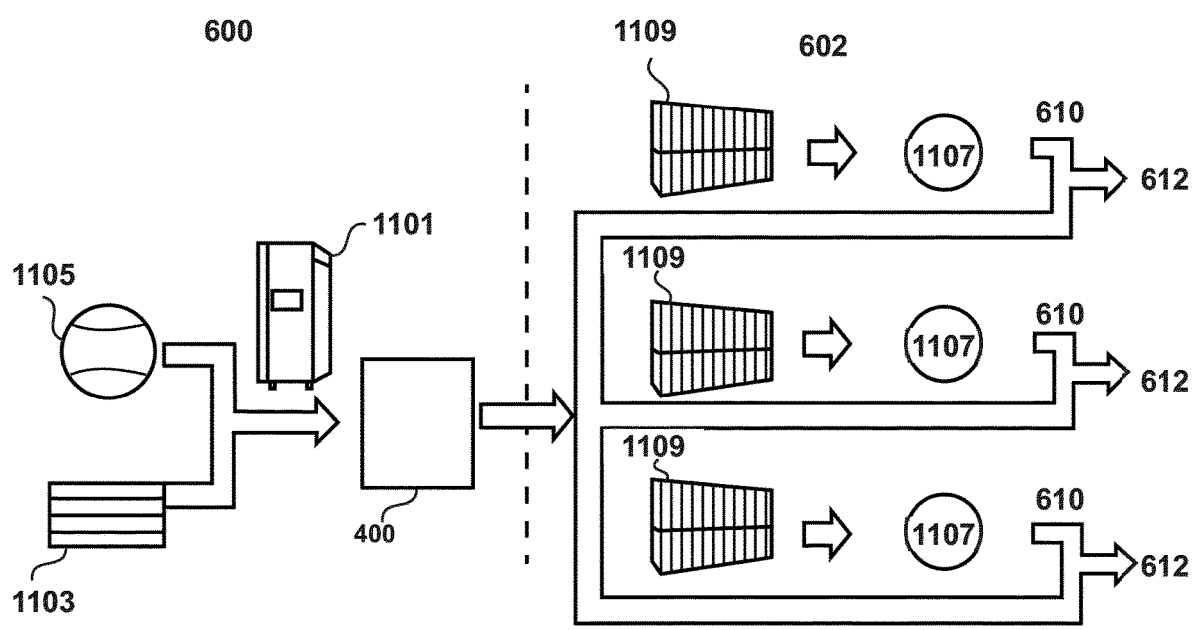
FIG. 11 illustrates a summary flow for the operations described above, according to an embodiment.

FIG. 11 illustrates a summary flow for the operations described above. FIG. 11 illustrates building the present aberration impact model 400 (e.g., the operations shown in FIG. 5) during an offline or research and development phase 600, and then using the model in a manufacturing phase 602 (e.g., as shown in FIG. 6). During phase 600, aberration impact model 400 may be calibrated based on simulated patterning system aberration calibration data and/or corresponding patterning process impact calibration data. Simulations may be performed with a simulation engine 1101 based on different mask designs 1103, pupil shapes 1105, and/or other information. In some embodiments, the simulation may be performed on a full-chip layout and thereby the resulting cost function, dependency matrix, or Hessian matrix accounts for the full-chip layout. As described herein, a cost function from aberration impact model 400 is configured for use by a projection optics correction model 610 (in combination with measured aberration data 1107 from a scanner (patterning system) 1109) to determine a set of patterning process control metrics, and facilitate dynamic in-situ aberration control 612. Aberration impact model 400 may take the form of an ADELasla file, for example, and/or any other scanner friendly light weight data format. As shown in FIG. 11, a single calibrated aberration impact model may be used by several different projection optics correction models 610 (associated with several different scanners 1109).

Dynamic in-situ aberration control 612 comprises adjusting, while in a manufacturing phase, the semiconductor device manufacturing process. Adjustments may be made based on output from a projection optics correction model and/or other information. Manufacturing process parameter adjustments may be determined (e.g., an amount a given parameter should be changed), and the manufacturing process parameters may be adjusted from prior parameter set points to new parameter set points, for example. In some embodiments, the determined and/or adjusted semiconductor device manufacturing process parameters comprise one or more of a pupil shape, a dose, a focus, a power setting, and/or other semiconductor device manufacturing process parameters. As an example, if the process parameter were a (e.g., new) pupil shape, or a new dose, a scanner could be adjusted from an old or previous pupil shape, or dose, to the determined (e.g., new) pupil shape, or dose. Several other similar examples are contemplated.

As described above, the model(s) described herein may have a wide range of applications. Another example application (e.g., beyond the mirror-heating and other examples described above) is co-optimization of multiple patterning systems using aberration impact modeling. A patterning system may include a scanner and/or other patterning systems. For example, calibrated aberration impact models can be used for wavefront tuning (e.g., instead of the full imaging simulations in the prior art systems) to ensure the same design layout prints the same on different scanners or at different slit locations.

As a reminder, an aberration impact model as described herein comprises a relatively simple hyperdimensional function configured to correlate the received patterning system aberration data with the new patterning process impact data. The hyperdimensional function is configured to correlate the received patterning system aberration data with the new patterning process impact data in an approximation form in lieu of a full simulation (without calculation of an aerial image). Multiple models can be used to describe the imaging performance of multiple scanners.

The present (aberration impact) model(s) are compact models with a reduced scope and improved runtime performance relative to prior models. The present models lend themselves to the co-optimization application at least because predicted impact is based (only) on aberration data, and the predicted impact may be specifically applied to pre-selected metrics such as critical dimensions, defect counts, etc.), which makes the models accurate, fast, and/or have other advantageous features. The present models can be dedicated for use cases where tuning is based only on relevant aberration data. Co-optimization of multiple patterning systems is possible because of the light weight nature of the present models and/or their other advantageous features.

For example, in some embodiments, one or more processors (e.g., one or more computers) may execute one or more electronic models (e.g., aberration impact models) for determining patterning process impact data without calculation of a patterning process aerial image representation. The patterning process impact data may be configured to facilitate co-optimization of multiple patterning systems used in a patterning process. The new patterning process impact data output from the model may be configured to facilitate co-optimization of multiple scanners used in the patterning process. Co-optimization may comprise using lens actuators as variables, and a gradient based non-linear optimizer to co-determine actuator positions for multiple scanners. In some embodiments, the new patterning process impact data from the model is configured to be used to determine a set of patterning process control metrics, with the set of patterning process control metrics configured to be determined by a linear solver (e.g., as described below).

Patterning system aberration data may be provided to a model (or multiple models) so that the model(s) (e.g., hyperdimensional functions) correlate the received patterning system aberration data with patterning process impact data. Different (aberration impact) models may correspond to different patterning systems (scanners). New patterning process impact data may be determined for the received patterning system aberration data. By way of a non-limiting example, the received patterning system aberration data may comprise received wavefront data, and the new patterning process impact data may comprise one or more patterning process metrics. Wavefront data may comprise measured or simulated wavefront data in the form of a Zernike list or pixelated bitmap, for example, and/or other wavefront data. In this example, the one or more patterning process metrics may include a critical dimension, a pattern placement error, an edge placement error, critical dimension asymmetry, a best focus shift, a defect count associated with a patterning process, and/or other metrics. In some embodiments, the new patterning process impact data is indicative of an impact, by a corresponding patterning system aberration, on one or more of a critical dimension, a pattern placement error, an edge placement error, critical dimension asymmetry, a best focus shift, a defect count associated with a patterning process, and/or other metrics.

In some embodiments, a given model comprises one or more critical feature components (e.g., one or more dimensions of a hyperdimensional function) configured to model scanner to scanner variation for critical features of a patterning process; one or more regulation components (e.g., one or more other dimensions of the hyperdimensional function) configured to model generic performance across scanners for non-critical features of the patterning process, and/or other components. The critical feature components of a given model are defined for (all) of the patterning systems (e.g., scanners) in a group of patterning systems that are being co-optimized. The critical feature components are configured to represent patterning system (e.g., scanner) to patterning system variation for critical features (e.g., critical dimension as one example) in a pattern. The regulation components of a model may be configured to represent non-critical features of a pattern. The regulation components of a model may represent generic performance of a given scanner (or other patterning systems) with respect to non-critical features of a pattern. This separate critical feature component/regulation component arrangement may allow users to customize the critical feature components of a model based on patterning system performance at a given manufacturing location for example, or other unique factors that affect critical features of a patterning process, while keeping non-varying or non-critical factors the same (or similar). For example, a user may provide a specific CD sensitivity that can be represented by the one or more critical feature components of the model for critical features of a pattern, but then allow the regulation components of the model to generate output for non-critical features of a pattern, where it does not make sense to spend significant resources on modelling and/or optimization.

Put another way, critical features may be specified by the user according to any suitable criteria, e.g., may be features that the user specifically cares about and/or features that have one or more issues which need to be resolved. Other features may be deemed regulation features. The critical feature component(s) and the regulation component(s) of a given model may be two different functions associated with these different types of features. In some embodiments, a user can define regulation features/functions (e.g., in addition to and/or instead of critical feature components/functions), but if the user defines a regulation feature/function, the present system may be configured such that the user defined feature/function (by definition) becomes critical.

Advantageously, any features/functions not specified by the user are handled by the model in a unified way known as the regulation features/functions.

In some embodiments, the new patterning process impact data from the model(s) is configured to be provided to a cost function to facilitate determination of costs associated with individual patterning process metrics and/or costs associated with individual patterning process variables. The costs associated with individual patterning process metrics and/or costs associated with individual patterning process variables are configured to be used to facilitate the co-optimization of the multiple scanners and/or for other purposes.

FIG. 12 illustrates components of an example cost function (s) 1200, according to an embodiment. As shown in FIG. 12, cost function 1200 comprises a first component 1202 associated with critical features of a patterning process, a second component 1204 associated with non-critical features of a patterning process, and a third component 1206 associated with physical functional limitations of one or more scanners and/or other patterning systems. Component 1202 is defined for (all) of the patterning systems (e.g., scanners) in the group of patterning systems that are being co-optimized. Component 1202 is configured to represent patterning system (e.g., scanner) to patterning system variation for critical features (e.g., critical dimension as one example). Component 1204 may be a lump-sum lithometric value for non-critical features common across the patterning systems. Component 1204 may represent generic performance of a given scanner with respect to non-critical features (e.g., a feature that likely prints well even without tuning). Component 1206 is unique to a given patterning system and is associated with specific physical limitations of the given patterning system (e.g., a motion range of a certain component, any offsets, certain parameters consistently shifted in the same way with regularity on that machine, etc.). In some embodiments, cost function 1200 further comprises a fourth component 1208 associated with a patterning process wavefront regulation penalty. Component 1208 is defined per individual scanner. Component 1208 is configured to represent and/or otherwise account for any extra desired user preferences regarding a wavefront itself (rather than its related lithography performance characteristics). For example, if two sets of wavefronts have the same lithography performance characteristics, the user may prefer one with a smaller root mean square (RMS) magnitude.

Figure 13:
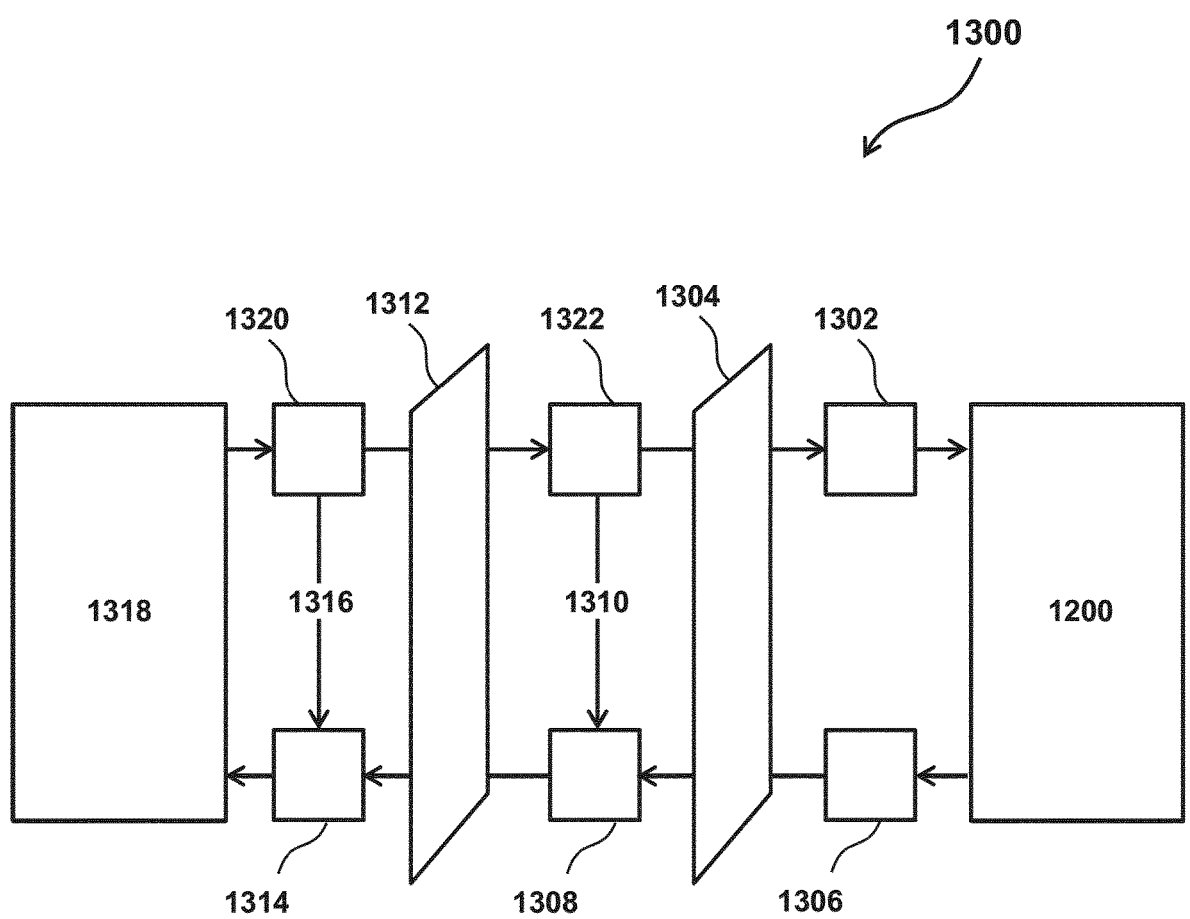
FIG. 13 illustrates example optimization architecture, according to an embodiment.

FIG. 13 illustrates example (co-)optimization architecture 1300, according to an embodiment. As shown in FIG. 13, in some embodiments, the new patterning process impact data 1302 from a model 1304 (e.g., an aberration impact model as described herein) is configured to be provided to cost function 1200 (e.g. comprising critical features and regulation features) to facilitate determination of costs 1306 associated with individual patterning process metrics (e.g., ds/dCD, etc.). Costs 1306 associated with the individual patterning process metrics are configured to be provided back to model 1304 to facilitate determination of and/or costs associated with patterning process wavefront regulation 1308 (e.g., ds/dwf). The costs associated with patterning process wavefront regulation 1308 may also be determined based on a wavefront regulation penalty 1310 (e.g., provided by a user), and/or other information. Costs 1308 associated with the patterning process wavefront regulation are configured to be provided to a driver lens model 1312, for example, to facilitate determination of costs associated with individual patterning process variables 1314 (e.g., ds/dv). Driver lens model 1312 may be a model that dictates how the tuning action of actuator knobs affect a wavefront, for example. Costs 1308 may also be determined based on physical functional limitations 1316 of one or more scanners and/or other patterning systems (e.g., an actuator consumption penalty) and/or other limitations. Costs 1314 associated with the individual patterning process variables are configured to be provided to an optimizer 1318 to facilitate co-optimization of multiple patterning systems (e.g., scanners). In general, an optimizer is a computer algorithm that finds the minimum of a given cost function. Optimizer 1318 may be a gradient based non-linear optimizer (e.g., an L-BFGS-B) configured to co-determine actuator positions for multiple scanners, for example. Optimizer 1318 may be formed by one or more processors configured to balance different possible process variables (e.g., each within their own allowable ranges) against manufacturing capabilities or costs associated with different metrics (e.g., critical dimension, a pattern placement error, an edge placement error, critical dimension asymmetry, a best focus shift, a defect count associated with a patterning process, and/or other metrics).

Also as shown in FIG. 13, optimizer 1318 may be configured to output one or more process variables (v) (e.g., lens actuator variables in this example) 1320, which are fed to driver lens model 1312 and converted to wavefront data 1322 ($wf$) (which is provided to model 1304 as described above). Diver lens model 1312 is configured to predict a resulting wavefront when the lens actuator variables are tuned.

Figure 14:
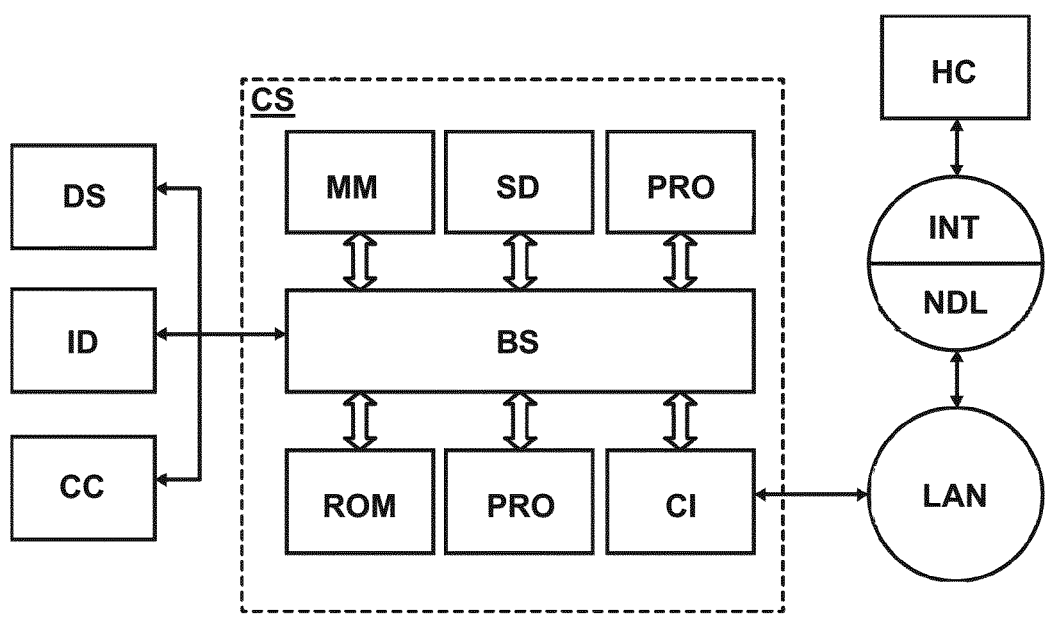
FIG. 14 is a block diagram of an example computer system, according to an embodiment.

FIG. 14 is a diagram of an example computer system CS that may be used for one or more of the operations described herein. Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) may use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 15:
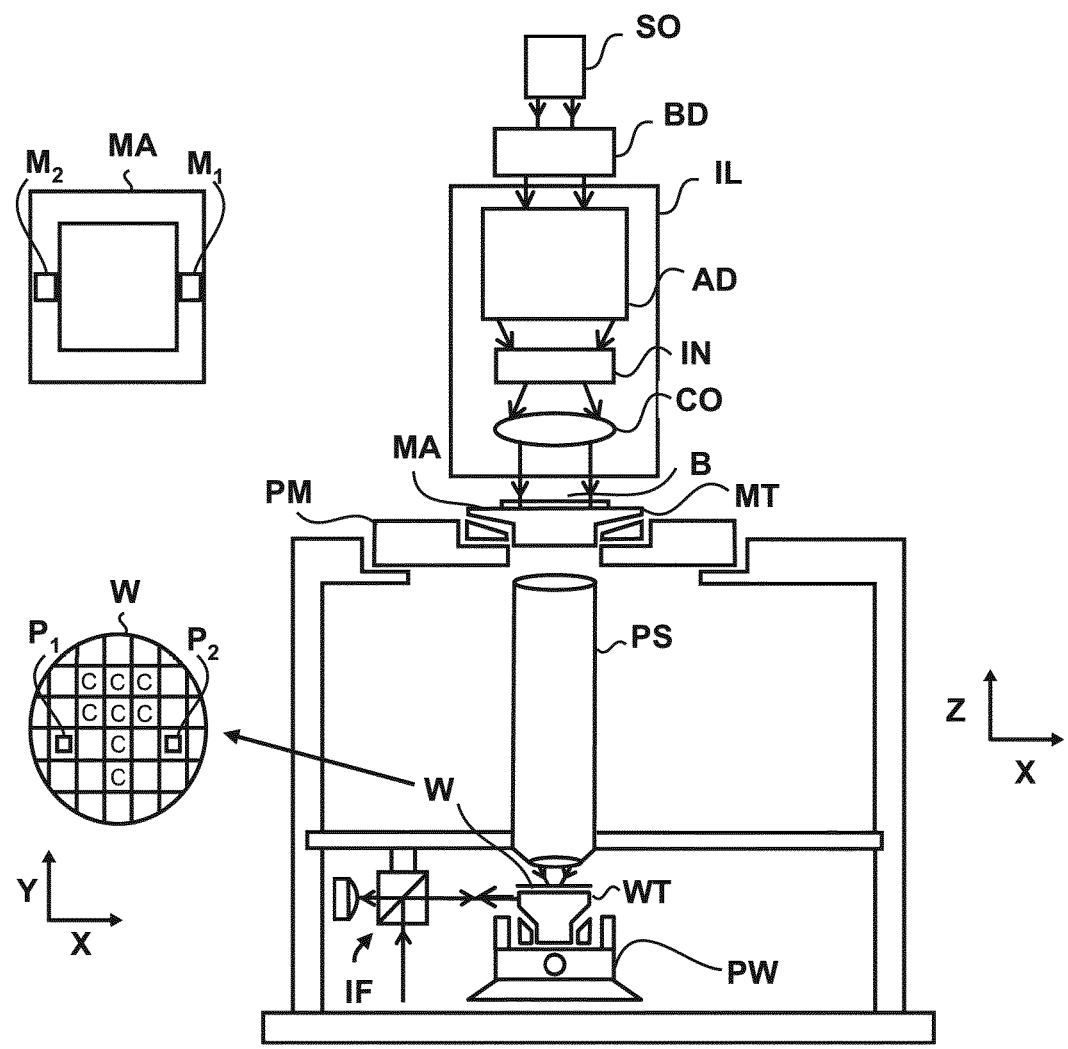
FIG. 15 is a schematic diagram of a lithographic projection apparatus, according to an embodiment.

FIG. 15 is a schematic diagram of a lithographic projection apparatus, according to an embodiment. The lithographic projection apparatus can include an illumination system IL, a first object table MT, a second object table WT, and a projection system PS. Illumination system IL, can condition a beam B of radiation. In this example, the illumination system also comprises a radiation source SO. First object table (e.g., a patterning device table) MT can be provided with a patterning device holder to hold a patterning device MA (e.g., a reticle), and connected to a first positioner to accurately position the patterning device with respect to item PS. Second object table (e.g., a substrate table) WT can be provided with a substrate holder to hold a substrate W (e.g., a resist-coated silicon wafer), and connected to a second positioner to accurately position the substrate with respect to item PS. Projection system (e.g., which includes a lens) PS (e.g., a refractive, catoptric or catadioptric optical system) can image an irradiated portion of the patterning device MA onto a target portion C (e.g., comprising one or more dies) of the substrate W. Patterning device MA and substrate W may be aligned using patterning device alignment marks M1, M2 and substrate alignment marks P1, P2, for example.

As depicted, the apparatus can be of a transmissive type (i.e., has a transmissive patterning device). However, in general, it may also be of a reflective type, for example (with a reflective patterning device). The apparatus may employ a different kind of patterning device for a classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander, or beam delivery system BD (comprising directing mirrors, the beam expander, etc.). for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus. The radiation beam that it produces may be led into the apparatus (e.g., with the aid of suitable directing mirrors), for example. This latter scenario can be the case when source SO is an excimer laser (e.g., based on KrF, ArF or F2 lasing), for example.

The beam B can subsequently intercept patterning device MA, which is held on a patterning device table MT. Having traversed patterning device MA, the beam B can pass through the lens PL, which focuses beam B onto target portion C of substrate W. With the aid of the second positioning means (and interferometric measuring means IF), the substrate table WT can be moved accurately, e.g. to position different target portions C in the path of beam B. Similarly, the first positioning means can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool), patterning device table MT may be connected to a short stroke actuator, or may be fixed.

The depicted tool can be used in two different modes, step mode and scan mode. In step mode, patterning device table MT is kept essentially stationary, and an entire patterning device image is projected in one operation (i.e., a single "flash") onto a target portion C. Substrate table WT can be shifted in the x and/or y directions so that a different target portion C can be irradiated by beam B. In scan mode, essentially the same scenario applies, except that a given target portion C is not exposed in a single "flash." Instead, patterning device table MT is movable in a given direction (e.g., the "scan direction", or the "y" direction) with a speed v, so that projection beam B is caused to scan over a patterning device image. Concurrently, substrate table WT is simultaneously moved in the same or opposite direction at a speed V=Mv, in which M is the magnification of the lens (typically, M=¼ or ⅕). In this manner, a relatively large target portion C can be exposed, without having to compromise on resolution.

Figure 16:
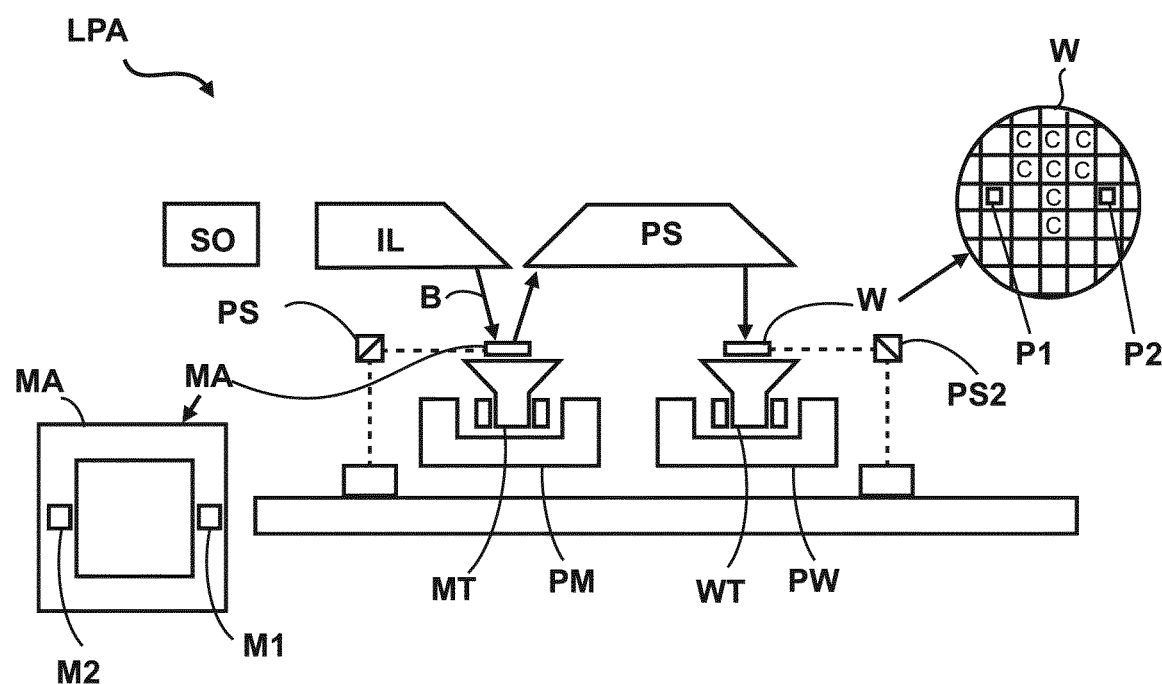
FIG. 16 is a schematic diagram of another lithographic projection apparatus, according to an embodiment.

FIG. 16 is a schematic diagram of another lithographic projection apparatus (LPA) that may be used for, and/or facilitating one or more of the operations described herein. LPA can include source collector module SO, illumination system (illuminator) IL configured to condition a radiation beam B (e.g. EUV radiation), support structure MT, substrate table WT, and projection system PS. Support structure (e.g. a patterning device table) MT can be constructed to support a patterning device (e.g. a mask or a reticle) MA and connected to a first positioner PM configured to accurately position the patterning device. Substrate table (e.g. a wafer table) WT can be constructed to hold a substrate (e.g. a resist coated wafer) W and connected to a second positioner PW configured to accurately position the substrate. Projection system (e.g. a reflective projection system) PS can be configured to project a pattern imparted to the radiation beam B by patterning device MA onto a target portion C (e.g. comprising one or more dies) of the substrate W.

As shown in this example, LPA can be of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP"), the plasma can be produced by irradiating a fuel, such as a droplet, stream or cluster of material having the line-emitting element, with a laser beam. Source collector module SO may be part of an EUV radiation system including a laser (not shown in FIG. 16), for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation. In this example, the laser may not be considered to form part of the lithographic apparatus and the radiation beam can be passed from the laser to the source collector module with the aid of a beam delivery system comprising, for example, suitable directing mirrors and/or a beam expander. In other examples, the source may be an integral part of the source collector module, for example when the source is a discharge produced plasma EUV generator, often termed a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder, or capacitive sensor), the substrate table WT can be moved accurately (e.g. to position different target portions C in the path of radiation beam B). Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode. In step mode, the support structure (e.g. patterning device table) MT and the substrate table WT are kept essentially stationary, while an entire pattern imparted to the radiation beam is projected onto a target portion C at one time (e.g., a single static exposure). The substrate table WT is then shifted in the X and/or Y direction so that a different target portion C can be exposed. In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de)magnification and image reversal characteristics of the projection system PS. In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 17:
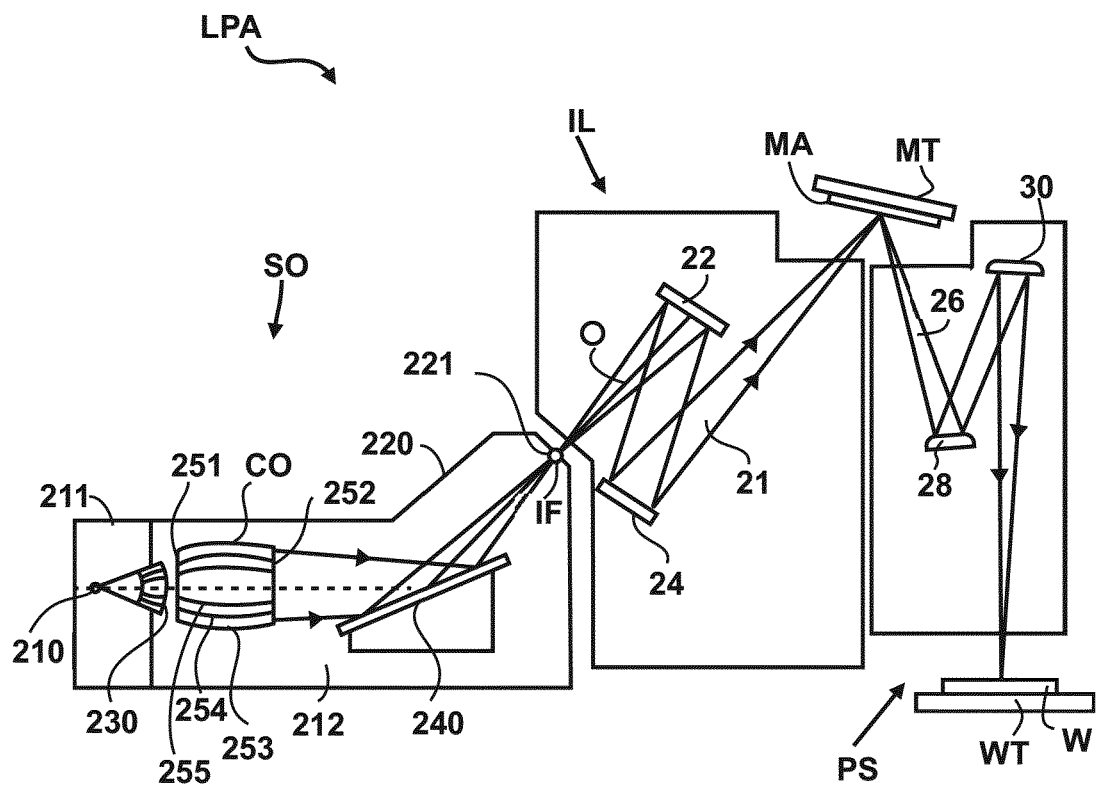
FIG. 17 is a detailed view of a lithographic projection apparatus, according to an embodiment.

FIG. 17 is a detailed view of the lithographic projection apparatus shown in FIG. 16. As shown in FIG. 17, the LPA can include the source collector module SO, the illumination system IL, and the projection system PS. The source collector module SO is configured such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier trap 230 (described below) also includes a channel structure. The collector chamber 211 may include a radiation collector CO which may be a grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line "O". The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT. More elements than shown may generally be present in illumination optics unit IL and projection system PS. The grating spectral filter 240 may optionally be present, depending upon the type of lithographic apparatus, for example. Further, there may be more mirrors present than those shown in the figures, for example there may be 1-6 additional reflective elements present in the projection system PS than shown in FIG. 15.

Collector optic CO, as illustrated in FIG. 17, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 18:
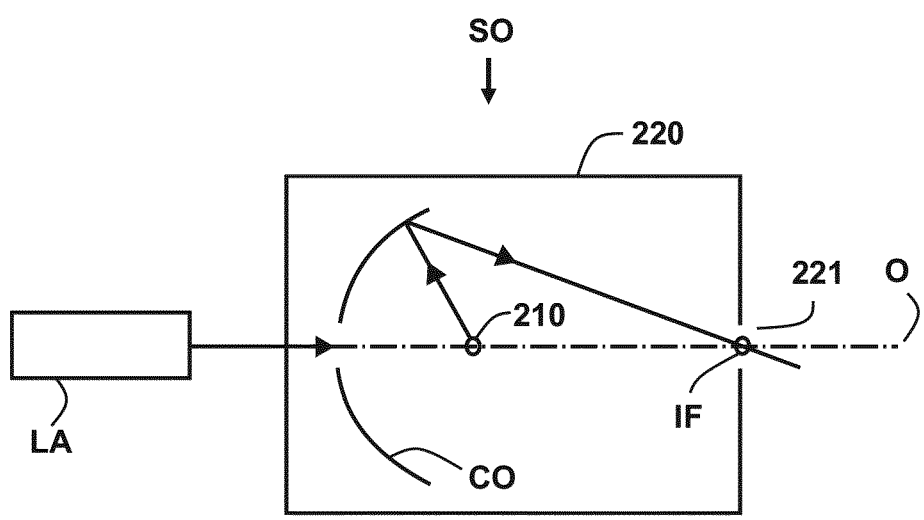
FIG. 18 is a detailed view of the source collector module of the lithographic projection apparatus, according to an embodiment.

FIG. 18 is a detailed view of source collector module SO of the lithographic projection apparatus LPA (shown in previous figures). Source collector module SO may be part of an LPA radiation system. A laser LA can be arranged to deposit laser energy into a fuel, such as xenon (Xe), tin (Sn) or lithium (Li), creating the highly ionized plasma 210 with electron temperatures of several 10"s of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be useful with emerging imaging technologies capable of producing increasingly shorter wavelengths. Emerging technologies include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

Embodiments of the present disclosure can be further described by the following clauses.
1. A non-transitory computer readable medium having instructions thereon, the instructions when executed by a computer, causing the computer to execute an electronic model for determining patterning process impact data without calculation of a patterning process aerial image representation, the patterning process impact data configured to facilitate co-optimization of multiple scanners used in a patterning process, the instructions causing operations comprising:
providing patterning system aberration data to the model, the model comprising a hyperdimensional function configured to correlate received patterning system aberration data with patterning process impact data; and determining, based on the model, new patterning process impact data for the received patterning system aberration data, wherein the new patterning process impact data from the model is configured to be provided to a cost function to facilitate determination of costs associated with individual patterning process metrics and/or costs associated with individual patterning process variables, and wherein the costs associated with individual patterning process metrics and/or costs associated with individual patterning process variables are configured to be used to facilitate the co-optimization of the multiple scanners 2. The medium of clause 1, wherein the patterning system aberration data provided to the model comprises wavefront data, and wherein the new patterning process impact data comprises one or more patterning process metrics.

3. The medium of clauses 1 or 2, wherein the model comprises one or more critical feature components configured to model scanner to scanner variation for critical features of a patterning process; and one or more regulation components configured to model generic performance across scanners for non-critical features of the patterning process.

4. The medium of any of clauses 1-3, wherein the cost function comprises a first component associated with critical features of a patterning process, a second component associated with non-critical features of a patterning process, and a third component associated with physical functional limitations of one or more scanners.

5. The medium of any of clauses 1-4, wherein the co-optimization comprises using lens actuators as variables, and a gradient based non-linear optimizer to co-determine actuator positions for multiple scanners.

6. A non-transitory computer readable medium having instructions thereon, the instructions when executed by a computer causing the computer to:
   execute a calibrated model configured to receive patterning system aberration data; and
   determine, based on the model, new patterning process impact data for the received patterning system aberration data;
   wherein the model comprises a hyperdimensional function configured to correlate the received patterning system aberration data with the new patterning process impact data without calculation of an aerial image representation.

7. The medium of clause 6, wherein the hyperdimensional function is configured to correlate the received patterning system aberration data with the new patterning process impact data in an approximation form in lieu of a full simulation.

8. The medium of any of clauses 6-7, wherein the model comprises one or more non-linear, linear, or quadratic algorithms.

9. The medium of any of clauses 6-8, wherein the received patterning system aberration data comprises received wavefront data, and wherein the new patterning process impact data comprises one or more patterning process metrics.

10. The medium of clause 9, wherein the one or more patterning process metrics comprise a critical dimension, a pattern placement error, an edge placement error, critical dimension asymmetry, a best focus shift, or a defect count associated with a patterning process.

11. The medium of any of clauses 6-9, wherein the model comprises one or more critical feature components configured to model patterning system to patterning system variation for critical features of a patterning process; and one or more regulation components configured to model generic performance across patterning systems for non-critical features of the patterning process.

12. The medium of any of clauses 6-11, wherein the new patterning process impact data from the model is configured to be provided to a cost function to facilitate determination of costs associated with individual patterning process metrics and/or costs associated with individual patterning process variables.

13. The medium of clause 12, wherein the cost function comprises a first component associated with critical features of a patterning process, a second component associated with non-critical features of a patterning process, and a third component associated with physical functional limitations of one or more patterning systems.

14. The medium of clause 13, wherein the cost function further comprises a fourth component associated with a patterning process wavefront regulation penalty.

15. The medium of any of clauses 6-14, wherein the new patterning process impact data output from the model is configured to facilitate co-optimization of multiple patterning systems.

16. The medium of clause 15, wherein the multiple patterning systems comprise scanners, and wherein the co-optimization comprises using lens actuators as variables, and a gradient based non-linear optimizer to co-determine actuator positions for multiple scanners.

17. The medium of any of clauses 6-16, wherein the new patterning process impact data from the model is configured to be used to determine a set of patterning process control metrics, the set of patterning process control metrics configured to be determined by a linear solver.

18. The medium of any of clauses 6-17, wherein the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

19. The medium of any of clauses 6-18, wherein:
   the new patterning process impact data from the model is configured to be provided to a cost function to facilitate determination of costs associated with individual patterning process metrics;
   the costs associated with the individual patterning process metrics are configured to be provided back to the model to facilitate determination of and/or costs associated with patterning process wavefront regulation;
   the costs associated with the patterning process wavefront regulation are configured to be provided to a driver lens model to facilitate determination of costs associated with individual patterning process variables; and
   the costs associated with the individual patterning process variables are configured to be provided to an optimizer to facilitate co-optimization of multiple patterning systems.

20. The medium of any of clauses 6-8, wherein the model is calibrated such that the new patterning process impact data is configured to facilitate enhanced control of heating of one or more mirrors and/or lenses of the patterning system.

21. A method for determining patterning process impact data without calculation of a patterning process aerial image representation, the method comprising:
   executing a calibrated model configured to receive patterning system aberration data; and determining, based on the model, new patterning process impact data for the received patterning system aberration data;

wherein the model comprises a hyperdimensional function configured to correlate the received patterning system aberration data with the new patterning process impact data without calculation of the aerial image representation.

22. The method of clause 21, wherein the hyperdimensional function is configured to correlate the received patterning system aberration data with the new patterning process impact data in an approximation form in lieu of a full simulation.

23. The method of any of clauses 21-22, wherein the model comprises one or more non-linear, linear, or quadratic algorithms.

24. The method of any of clauses 21-23, wherein the received patterning system aberration data comprises received wavefront data, and wherein the new patterning process impact data comprises one or more patterning process metrics.

25. The method of clause 24, wherein the one or more patterning process metrics comprise a critical dimension, a pattern placement error, an edge placement error, critical dimension asymmetry, a best focus shift, or a defect count associated with a patterning process.

26. The method of any of clauses 21-25, wherein the model comprises one or more critical feature components configured to model patterning system to patterning system variation for critical features of a patterning process; and one or more regulation components configured to model generic performance across patterning systems for non-critical features of the patterning process.

27. The method of any of clauses 21-26, wherein the new patterning process impact data from the model is configured to be provided to a cost function to facilitate determination of costs associated with individual patterning process metrics and/or costs associated with individual patterning process variables.

28. The method of clause 27, wherein the cost function comprises a first component associated with critical features of a patterning process, a second component associated with non-critical features of a patterning process, and a third component associated with physical functional limitations of one or more patterning systems.

29. The method of clause 28, wherein the cost function further comprises a fourth component associated with a patterning process wavefront regulation penalty.

30. The method of any of clauses 21-29, wherein the new patterning process impact data output from the model is configured to facilitate co-optimization of multiple patterning systems.

31. The method of clause 30, wherein the multiple patterning systems comprise scanners, and wherein the co-optimization comprises using lens actuators as variables, and a gradient based non-linear optimizer to co-determine actuator positions for multiple scanners.

32. The method of any of clauses 21-31, wherein the new patterning process impact data from the model is configured to be used to determine a set of patterning process control metrics, the set of patterning process control metrics configured to be determined by a linear solver.

33. The method of any of clauses 21-32, wherein the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

34. The method of any of clauses 21-33, wherein:
the new patterning process impact data from the model is configured to be provided to a cost function to facilitate determination of costs associated with individual patterning process metrics;
the costs associated with the individual patterning process metrics are configured to be provided back to the model to facilitate determination of and/or costs associated with patterning process wavefront regulation;
the costs associated with the patterning process wavefront regulation are configured to be provided to a driver lens model to facilitate determination of costs associated with individual patterning process variables; and
the costs associated with the individual patterning process variables are configured to be provided to an optimizer to facilitate co-optimization of multiple patterning systems.

35. The method of any of clauses 21-34, wherein the model is calibrated such that the new patterning process impact data is configured to facilitate enhanced control of heating of one or more mirrors and/or lenses of the patterning system.

36. One or more non-transitory, computer-readable media storing a prediction model and instructions that, when executed by one or more processors, provides the prediction model, the prediction model being produced by:
obtaining patterning system aberration data and corresponding patterning process impact data;
providing the patterning system aberration data to a base prediction model to obtain a prediction of the patterning process impact data; and
using the patterning process impact data as feedback to update one or more configurations of the base prediction model, wherein the one or more configurations are updated based on a comparison between the patterning process impact data and the prediction of the patterning process impact data,
wherein the prediction model comprises a hyperdimensional function configured to correlate the patterning system aberration data with the patterning process impact data without calculation of an aerial image representation.

37. The medium of clause 36, wherein the prediction model comprises a linear or quadratic algorithm.

38. The medium of clause 37, wherein updating the one or more configurations of the prediction model comprises calibrating one or more parameters of the function.

39. The medium of any of clauses 36-38, wherein the patterning system aberration data are simulated based on associated pupil shapes and patterning device designs.

40. The medium of any of clauses 36-39, wherein the patterning process impact data comprises a cost function for a corresponding patterning system aberration, s(Z), the patterning system aberration defined by the patterning system aberration data.

41. A non-transitory computer readable medium having instructions thereon, the instructions when executed by a computer causing the computer to:
execute a calibrated model configured to receive patterning system aberration data, the model calibrated with patterning system aberration calibration data and corresponding patterning process impact calibration data; and determine, based on the model, new patterning process impact data for the received patterning system aberration data;

wherein the model comprises a hyperdimensional function configured to correlate the received patterning system aberration data with the new patterning process impact data without calculation of an aerial image representation.

42. The medium of clause 41, wherein the hyperdimensional function is configured to correlate the received patterning system aberration data with the new patterning process impact data in a simplified form in lieu of a full simulation.

43. The medium of clause 41 or 42, wherein the model is calibrated by providing the patterning system aberration calibration data to a base model to obtain a prediction of the patterning process impact calibration data, and using the patterning process impact calibration data as feedback to update one or more configurations of the base model, wherein the one or more configurations are updated based on a comparison between the patterning process impact calibration data and the prediction of the patterning process impact calibration data.

44. The medium of clause any of clauses 41-43, wherein the model comprises a linear or quadratic algorithm.

45. The medium of any of clauses 43-44, wherein updating the one or more configurations of the base model comprises calibrating one or more parameters of the function.

46. The medium of any of clauses 41-45, wherein the patterning system aberration calibration data are simulated based on associated pupil shapes and patterning device designs.

47. The medium of any of clauses 41-46, wherein the new patterning process impact data comprises a cost function for a corresponding patterning system aberration, s(Z), the patterning system aberration defined by the received patterning system aberration data.

48. The medium of clause 47, wherein the cost function s(Z) is indicative of an impact on the patterning process caused by the corresponding patterning system aberration.

49. The medium of any of clauses 41-48, wherein the new patterning process impact data from the model is configured to be provided to a second model to facilitate dynamic in-situ aberration control of a patterning system.

50. The medium of clause 49, wherein the second model is a projection optics correction model.

51. The medium of clause 49 or 50, wherein the patterning system comprises a scanner, and wherein dynamic in-situ control of the scanner comprises generating a corrected scanner control parameter recipe for a given scanner aberration to optimize a set of lithography performance metrics.

52. The medium of any of clauses 41-51, wherein the new patterning process impact data from the model is configured to be used to determine a set of patterning process control metrics, the set of patterning process control metrics configured to be determined by a linear solver.

53. The medium of clause 52, wherein the patterning process control metrics comprise lithography metrics.

54. The medium of clauses 52 or 53, wherein the new patterning process impact data from the model comprises a cost function Hessian, and wherein determining the set of patterning process control metrics comprises performing a singular value decomposition on the Hessian.

55. The medium of any of clauses 41-54, wherein the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

56. The medium of any of clauses 41-55, wherein the model is calibrated such that the new patterning process impact data is configured to facilitate enhanced control of heating of one or more mirrors and/or lenses of the patterning system.

57. The medium of any of clauses 41-56, wherein the model is calibrated such that the new patterning process impact data is configured to facilitate enhanced control of a focus, a dose, and/or stage variation (MSD) associated with the patterning system.

58. A method for determining patterning process impact data, the method comprising:

executing a calibrated model configured to receive patterning system aberration data, the model calibrated with patterning system aberration calibration data and corresponding patterning process impact calibration data; and determining, based on the model, new patterning process impact data for the received patterning system aberration data;

wherein the model comprises a hyperdimensional function configured to correlate the received patterning system aberration data with the new patterning process impact data without calculation of an aerial image representation.

59. The method of clause 58, wherein the hyperdimensional function is configured to correlate the received patterning system aberration data with the new patterning process impact data in a simplified form in lieu of a full simulation.

60. The method of clause 58 or 59, wherein the model is calibrated by providing the patterning system aberration calibration data to a base model to obtain a prediction of the patterning process impact calibration data, and using the patterning process impact calibration data as feedback to update one or more configurations of the base model, wherein the one or more configurations are updated based on a comparison between the patterning process impact calibration data and the prediction of the patterning process impact calibration data.

61. The method of clause any of clauses 58-60, wherein the model comprises a linear or quadratic algorithm.

62. The method of any of clauses 60-61, wherein updating the one or more configurations of the base model comprises calibrating one or more parameters of the function.

63. The method of any of clauses 58-62, wherein the patterning system aberration calibration data are simulated based on associated pupil shapes and patterning device designs.

64. The method of any of clauses 58-63, wherein the new patterning process impact data comprises a cost function for a corresponding patterning system aberration, s(Z), the patterning system aberration defined by the received patterning system aberration data.

65. The method of clause 64, wherein the cost function s(Z) is indicative of an impact on the patterning process caused by the corresponding patterning system aberration.

66. The method of any of clauses 58-65, wherein the new patterning process impact data from the model is configured to be provided to a second model to facilitate dynamic in-situ aberration control of a patterning system.

67. The method of clause 66, wherein the second model is a projection optics correction model.

68. The method of clause 66 or 67, wherein the patterning system comprises a scanner, and wherein dynamic in-situ control of the scanner comprises generating a corrected scanner control parameter recipe for a given scanner aberration to optimize a set of lithography performance metrics.

69. The method of any of clauses 58-68, wherein the new patterning process impact data from the model is configured to be used to determine a set of patterning process control metrics, the set of patterning process control metrics configured to be determined by a linear solver.

70. The method of clause 69, wherein the patterning process control metrics comprise lithography metrics.

71. The method of clauses 69 or 70, wherein the new patterning process impact data from the model comprises a cost function Hessian, and wherein determining the set of patterning process control metrics comprises performing a singular value decomposition on the Hessian.

72. The method of any of clauses 58-71, wherein the new patterning process impact data is indicative of an impact, by a corresponding patterning system aberration, on one or more of a critical dimension, a pattern placement error, an edge placement error, critical dimension asymmetry, a best focus shift, or a defect count associated with a patterning process.

73. The method of any of clauses 58-72, wherein the model is calibrated such that the new patterning process impact data is configured to facilitate enhanced control of heating of one or more mirrors and/or lenses of the patterning system.

74. The method of any of clauses 58-73, wherein the model is calibrated such that the new patterning process impact data is configured to facilitate enhanced control of a focus, a dose, and/or stage variation (MSD) associated with the patterning system.

75. A non-transitory computer readable medium having instructions thereon, the instructions when executed by a computer causing the computer to perform the method in any of clauses 58-74.

While the concepts disclosed herein may be used for wafer manufacturing on a substrate such as a silicon wafer, it shall be understood that the disclosed concepts may be used with any type of manufacturing system (e.g., those used for manufacturing on substrates other than silicon wafers).

In addition, the combination and sub-combinations of disclosed elements may comprise separate embodiments. For example, the aberration impact model and the projection optics model may be included in separate embodiments, or they may be included together in the same embodiment.

The descriptions above are intended to be illustrative, not limiting. Thus, it will be apparent to one skilled in the art that modifications may be made as described without departing from the scope of the claims set out below.

The invention claimed is:

1. A non-transitory computer readable medium having instructions therein, the instructions, when executed by a computer system, configured to cause the computer system to at least:
   execute a calibrated model configured to receive patterning system aberration data, the model calibrated with patterning system aberration calibration data and corresponding patterning process impact calibration data and the patterning process impact data being indicative of an impact with respect to a substrate patterned using the patterning system; and
   determine, based on the model, new patterning process impact data for the received patterning system aberration data,
   wherein the model comprises a hyperdimensional function configured to correlate the received patterning system aberration data with the new patterning process impact data in a simplified form without calculation of an aerial image representation.

2. The medium of claim 1, wherein the model is calibrated by providing patterning system aberration calibration data to a base model to obtain a prediction of the patterning process impact calibration data, and using the patterning process impact calibration data as feedback to update one or more configurations of the base model, wherein the one or more configurations are updated based on a comparison between the patterning process impact calibration data and the prediction of the patterning process impact calibration data.

3. The medium of claim 1, wherein the model comprises a linear or quadratic algorithm or a combination thereof.

4. The medium of claim 2, wherein the patterning system aberration calibration data are simulated based on associated pupil shapes and layer-specific patterning device designs.

5. The medium of claim 1, wherein the new patterning process impact data comprises a cost function for a corresponding patterning system aberration, $s(Z)$, the patterning system aberration defined by the received patterning system aberration data, wherein the cost function $s(Z)$ is indicative of an impact on the patterning process caused by the corresponding patterning system aberration.

6. The medium of claim 1, wherein the new patterning process impact data from the model is configured to be provided to a second model to enable dynamic in-situ aberration control of a patterning system, wherein the second model is a projection optics correction model.

7. The medium of claim 6, wherein the patterning system comprises a scanner, and wherein dynamic in-situ control of the scanner comprises generating a corrected scanner control parameter recipe for a given scanner aberration to optimize a set of lithography performance metrics.

8. The medium of claim 1, wherein the new patterning process impact data from the model is configured to be used to determine a set of patterning process control metrics, the set of patterning process control metrics configured to be determined by a linear solver.

9. The medium of claim 8, wherein determining the set of patterning process control metrics comprises performing a singular value decomposition on a cost function Hessian.

10. The medium of claim 8, wherein the set of patterning process control metrics comprises one or more lithography metrics, and wherein the new patterning process impact data is indicative of an impact, by a corresponding patterning system aberration, on one or more selected from: a critical dimension, a pattern placement error, an edge placement error, critical dimension asymmetry, a best focus shift, or a defect count associated with a patterning process.

11. The medium of claim 1, wherein the model is calibrated such that the new patterning process impact data is configured to facilitate enhanced control of an effect from heating of one or more mirrors and/or lenses of the patterning system.

12. The medium of claim 1, wherein the new patterning process impact data from the model is configured to be provided to a cost function to facilitate determination of costs associated with individual patterning process metrics and/or costs associated with individual patterning process variables, and wherein the costs associated with individual patterning process metrics and/or costs associated with individual patterning process variables are configured to be used to facilitate co-optimization of multiple scanners.

13. The medium of claim 12, wherein the model comprises one or more critical feature components configured to model scanner to scanner variation for critical features of a patterning process; and one or more regulation components configured to model generic performance across scanners for non-critical features of the patterning process.

14. The medium of claim 12, wherein the cost function comprises two or more selected from: a first component associated with critical features of a patterning process, a second component associated with non-critical features of a patterning process, and/or a third component associated with physical functional limitations of one or more scanners.

15. The medium of claim 12, wherein the co-optimization comprises using lens actuators as variables, and a gradient based non-linear optimizer to co-determine actuator positions for multiple scanners.

16. A method comprising:
   executing a model configured to receive patterning system aberration data; and
   determining, based on the model, patterning process impact data for the received patterning system aberration data, the patterning process impact data indicative of an impact with respect to a substrate patterned using the patterning system,
   wherein the model comprises a hyperdimensional function configured to correlate the received patterning system aberration data with patterning process impact data without calculation of the aerial image representation.

17. The method of claim 16, wherein the hyperdimensional function is configured to correlate the received patterning system aberration data with the patterning process impact data in an approximation form in lieu of a full simulation.

18. The method of claim 16, wherein the received patterning system aberration data comprises received wavefront data, and wherein the patterning process impact data comprises one or more patterning process metrics.

19. The method of claim 16, wherein the model comprises one or more critical feature components configured to model patterning system to patterning system variation for critical features of a patterning process; and one or more regulation components configured to model generic performance across patterning systems for non-critical features of the patterning process.

20. The method of claim 16, further comprising providing the patterning process impact data from the model to a cost function to facilitate determination of costs associated with individual patterning process metrics and/or costs associated with individual patterning process variables.

* * * * *